United States Patent
Okada et al.

(10) Patent No.: US 7,146,035 B2
(45) Date of Patent: Dec. 5, 2006

(54) PATTERN IMAGE COMPARISON METHOD, PATTERN IMAGE COMPARISON DEVICE, AND PROGRAM

(75) Inventors: Tomoyuki Okada, Kawasaki (JP); Seiji Makino, Kawasaki (JP); Kouichi Suzuki, Kawasaki (JP); Takahisa Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 694 days.

(21) Appl. No.: 10/393,980

(22) Filed: Mar. 24, 2003

(65) Prior Publication Data
US 2003/0228048 A1 Dec. 11, 2003

(30) Foreign Application Priority Data
Jun. 11, 2002 (JP) ............................. 2002-170240

(51) Int. Cl.
G06K 9/00 (2006.01)
G06K 9/62 (2006.01)
G06K 9/68 (2006.01)

(52) U.S. Cl. .................. 382/144; 382/209; 382/218

(58) Field of Classification Search ........ 382/144–145, 382/148–149, 151, 190, 199, 209, 218, 288, 382/294
See application file for complete search history.

(56) References Cited

U.S. PATENT DOCUMENTS

| | | | | |
|---|---|---|---|---|
| 4,926,489 A * | 5/1990 | Danielson et al. | .......... | 382/144 |
| 5,872,862 A * | 2/1999 | Okubo et al. | ................ | 382/151 |
| 5,900,941 A * | 5/1999 | Matsuyama et al. | ........ | 356/394 |
| 6,522,776 B1 * | 2/2003 | Ehrichs | ...................... | 382/144 |
| 6,690,469 B1 * | 2/2004 | Shibata et al. | .............. | 356/369 |
| 6,757,875 B1 * | 6/2004 | Matsuoka | ...................... | 716/4 |

FOREIGN PATENT DOCUMENTS

JP 2001-281178 10/2001

\* cited by examiner

Primary Examiner—Daniel Mariam
(74) Attorney, Agent, or Firm—Staas & Halsey LLP

(57) ABSTRACT

A pattern image comparison method is provided which comprises a first input step of inputting a first pattern image based on design data for a reticle mask or a semiconductor device; a second input step of inputting a second pattern image of the reticle mask or semiconductor device manufactured based on the design data; a calculation step of calculating at least one parameter of parameters including a part or all of area, outer periphery, barycenter, and diagonal line of the first pattern image and the second pattern image; and an output step of outputting a result of comparison of a pattern on the reticle mask or semiconductor device and a pattern of the design data based on the calculated parameters of the first and second pattern images.

21 Claims, 19 Drawing Sheets

F I G. 1
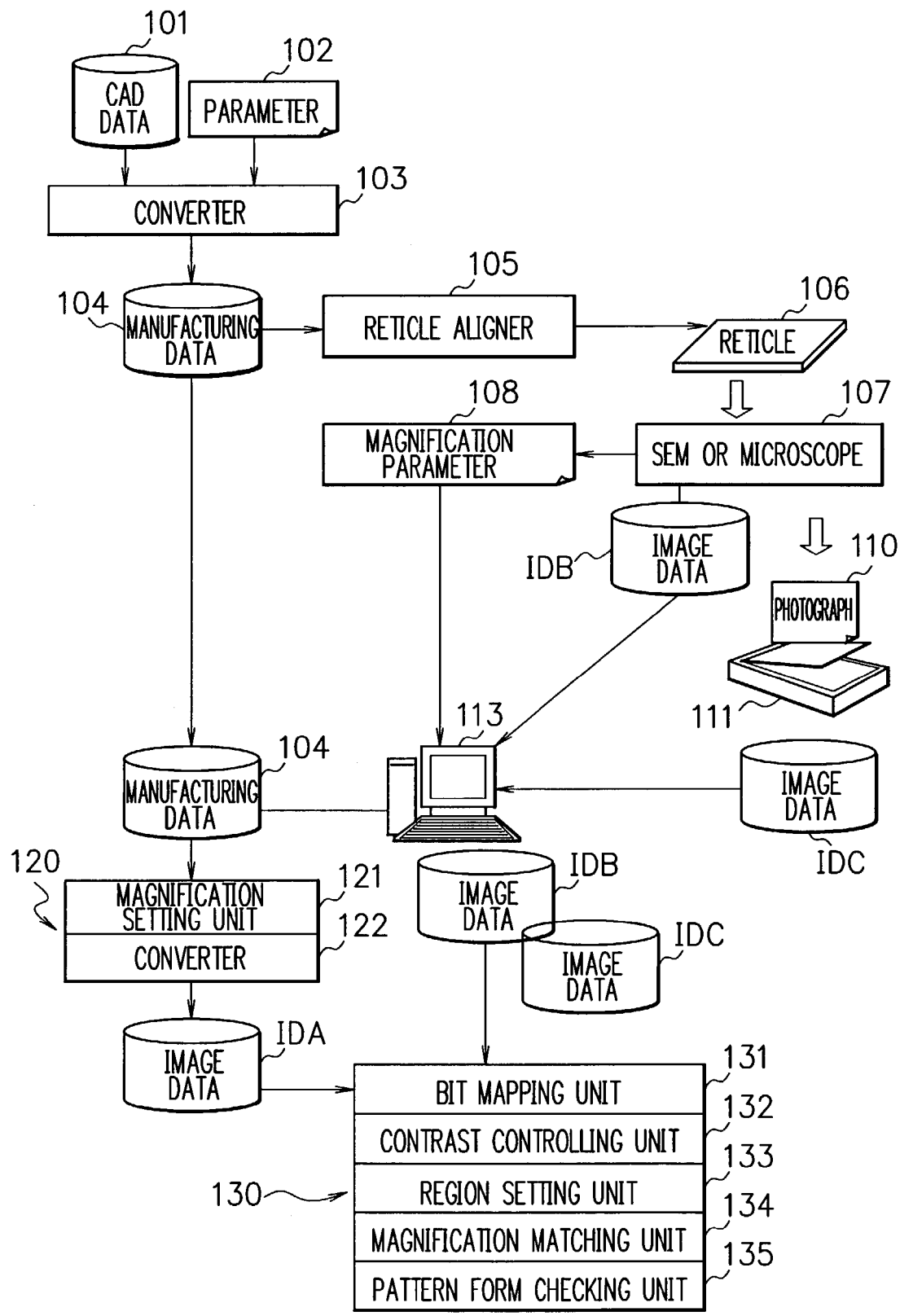

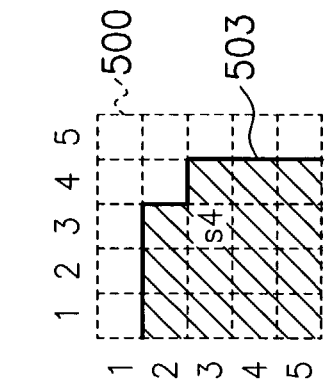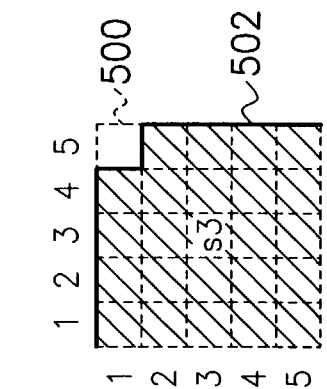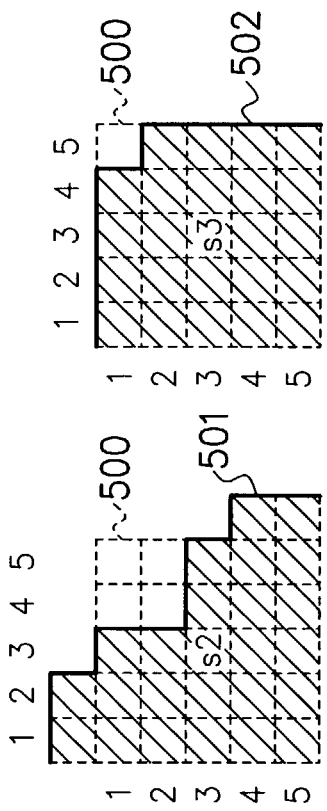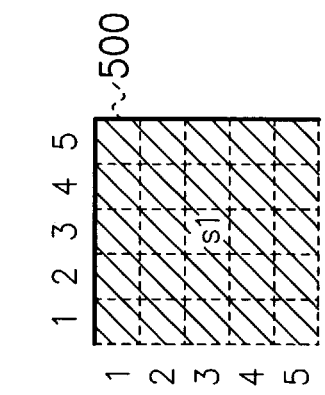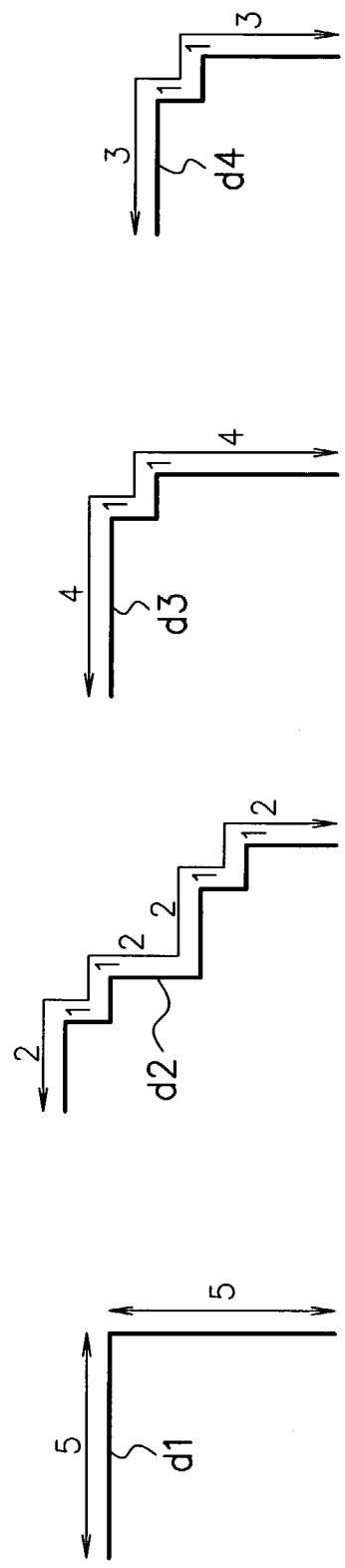
FIG. 5A  FIG. 5B  FIG. 5C  FIG. 5D

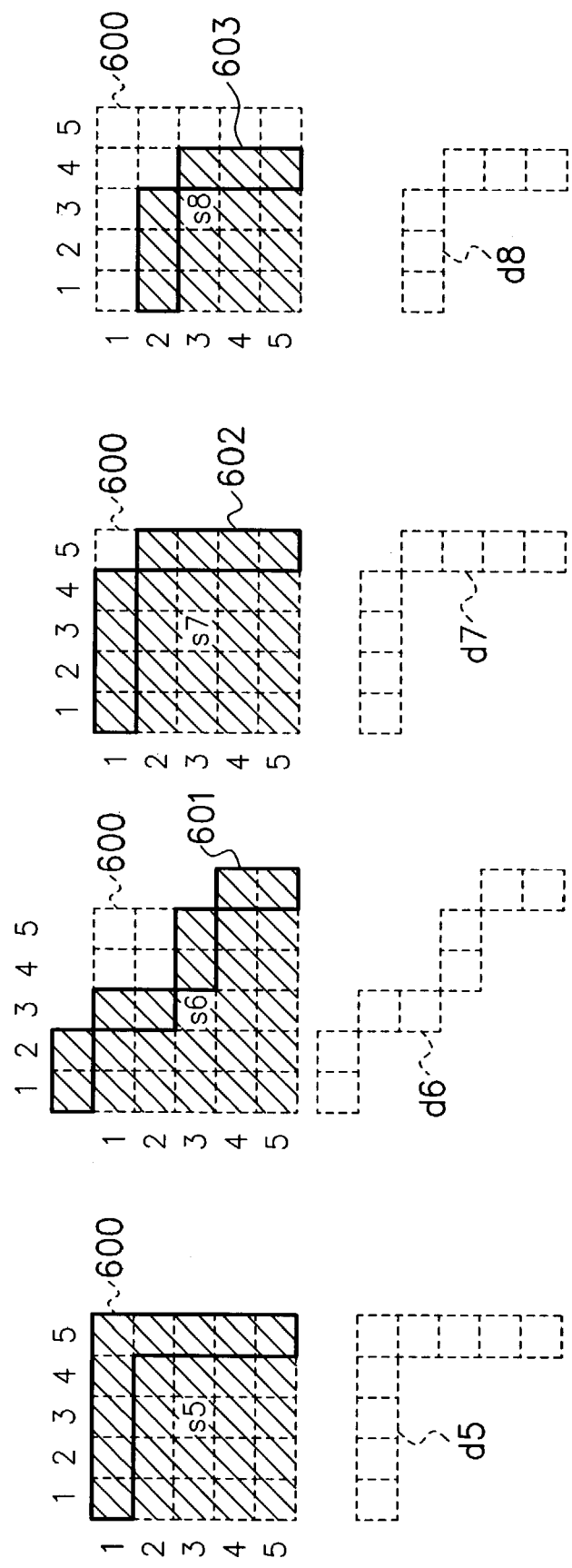

F I G. 9A 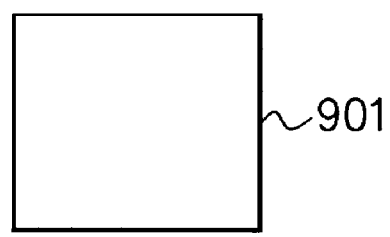
F I G. 9B 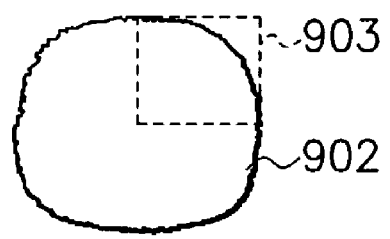
F I G. 10A 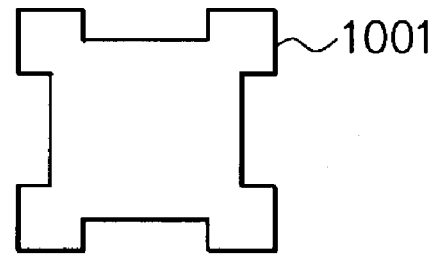
F I G. 10B 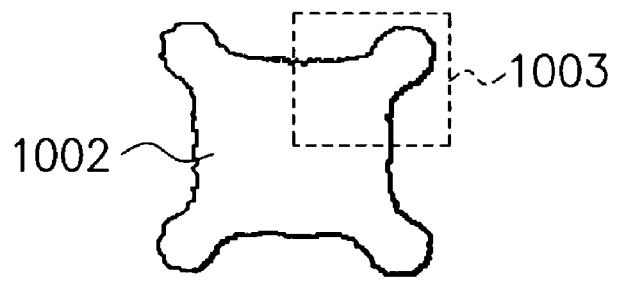

F I G. 12A
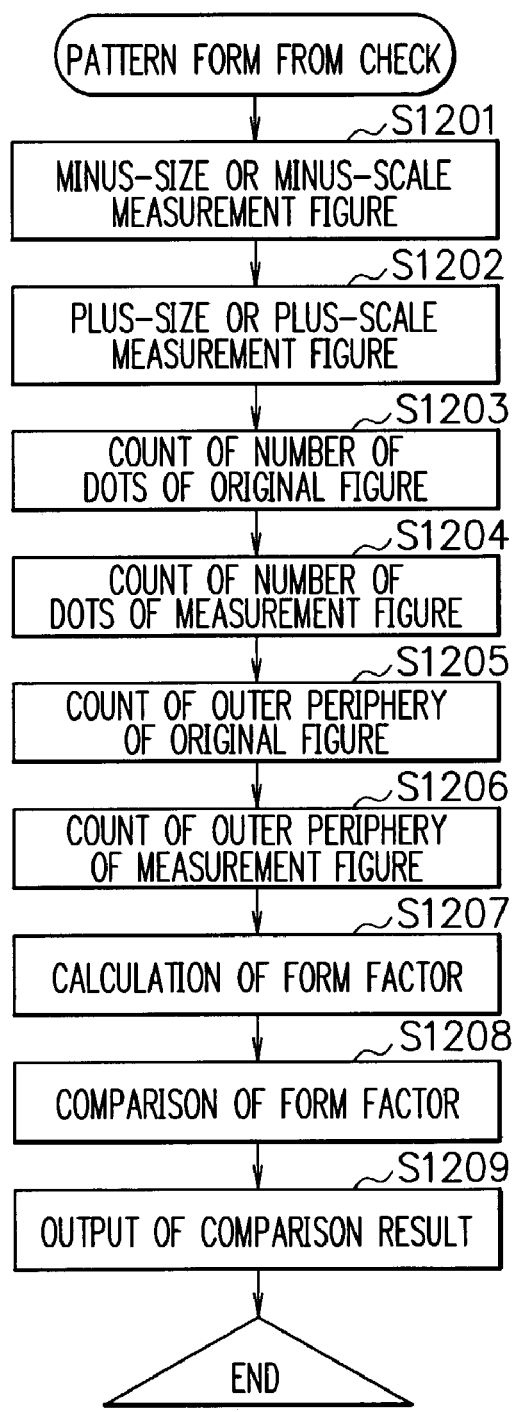
F I G. 12B
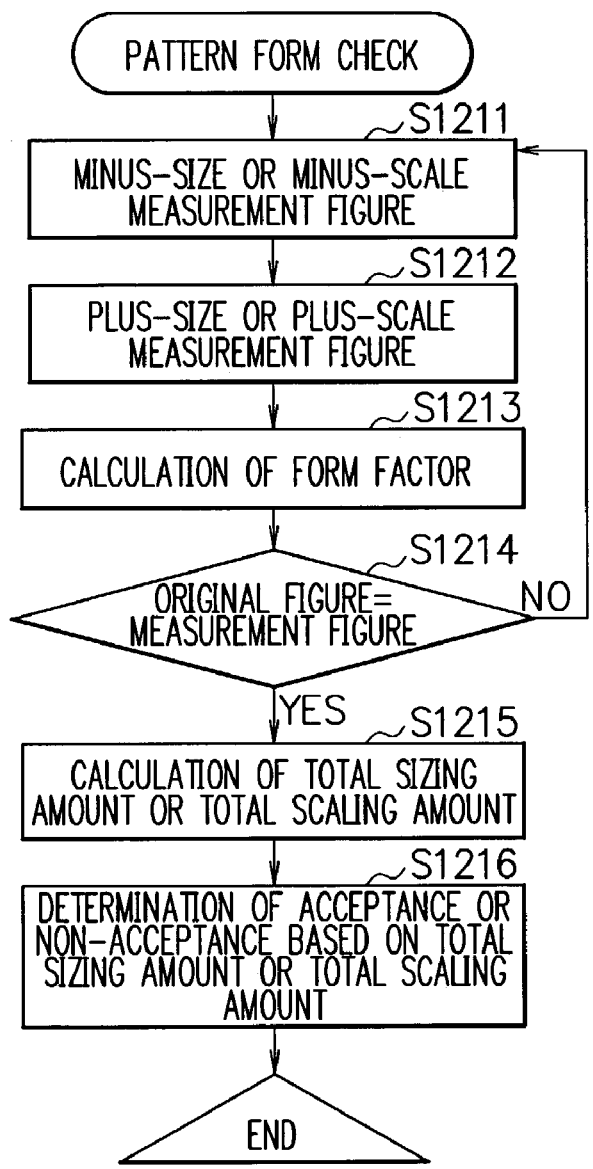

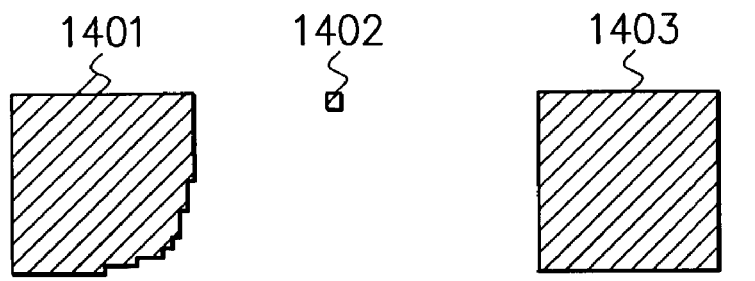
F I G. 14A
F I G. 14B

PATTERN IMAGE COMPARISON METHOD, PATTERN IMAGE COMPARISON DEVICE, AND PROGRAM

CROSS-REFERENCE TO RELATED APPLICATIONS

This application is based upon and claims the benefit of priority from the prior Japanese Patent Application No. 2002-170240, filed on Jun. 11, 2002, the entire contents of which are incorporated herein by reference.

BACKGROUND OF THE INVENTION

1. Field of the Invention

The present invention relates to a pattern image comparison technology and, more specifically, to a technology of comparing a pattern image of design data and a pattern image of a reticle mask or semiconductor device.

2. Description of the Related Art

In fabrication of a reticle mask in recent years, the quality of the reticle mask depends on whether a pattern transferred onto a substrate such as a semiconductor wafer or the like can accurately reproduce a design pattern by performing an OPC processing (Optical Proximity Correction method).

However, an auxiliary pattern or the like for use in the OPC processing and the like may be formed into a different pattern due to a change not only in dimension but also in form or area. To assure the transferred pattern, what is required hereafter is assurance by form, area, or the like using a two-dimensional pattern. Further, the pattern form needs to be managed through use of a numeric value (defining as no problem to values less than a certain value) for assurance of the pattern form. Conventionally, there has been no definition of converting the pattern form into a numeric value, causing great difficulty in setting of a tolerance.

SUMMARY OF THE INVENTION

It is an object of the present invention to facilitate management of pattern assurance by calculating parameters which can be converted into numeric values and comparing a pattern image of design data and a pattern image of a reticle mask or semiconductor device.

According to an aspect of the present invention, a pattern image comparison method is provided which comprises a first input step of inputting a first pattern image based on design data for a reticle mask or a semiconductor device; a second input step of inputting a second pattern image of the reticle mask or semiconductor device manufactured based on the design data; a calculation step of calculating at least one parameter of parameters including a part or all of area, outer periphery, barycenter, and diagonal line of the first pattern image and the second pattern image; and an output step of outputting a result of comparison of a pattern on the reticle mask or semiconductor device and a pattern of the design data based on the calculated parameters of the first and second pattern images.

Parameters that can be converted into numeric values are calculated to compare the pattern image of the design data and the pattern image of the reticle mask or semiconductor device, thus facilitating comparison and enabling easy management of pattern assurance. Further, the pattern can be assured with reliability for assurance of the pattern on the reticle mask and the semiconductor device, resulting in improved yield and performance of the reticle mask and the semiconductor device.

BRIEF DESCRIPTION OF THE DRAWINGS

FIG. 1 is a diagram showing the configuration of a pattern image comparison apparatus according to a first embodiment of the present invention;

FIGS. 5A to 5D are views illustrating the processing of comparing areas and outer peripheries of two pattern images;

FIGS. 6A to 6D are views illustrating another processing of comparing areas and outer peripheries of the two pattern images;

FIGS. 9A and 9B are views for explaining a specific example of the processing in FIG. 8;

FIGS. 10A and 10B are views for explaining another specific example of the processing in FIG. 8;

FIGS. 12A and 12B are flowcharts showing details of pattern form check processing according to a second embodiment of the present invention;

FIGS. 14A and 14B are views for explaining another specific example of the processing in FIG. 12A;

DETAILED DESCRIPTION OF THE PREFERRED EMBODIMENTS

First Embodiment

Figure 2A:
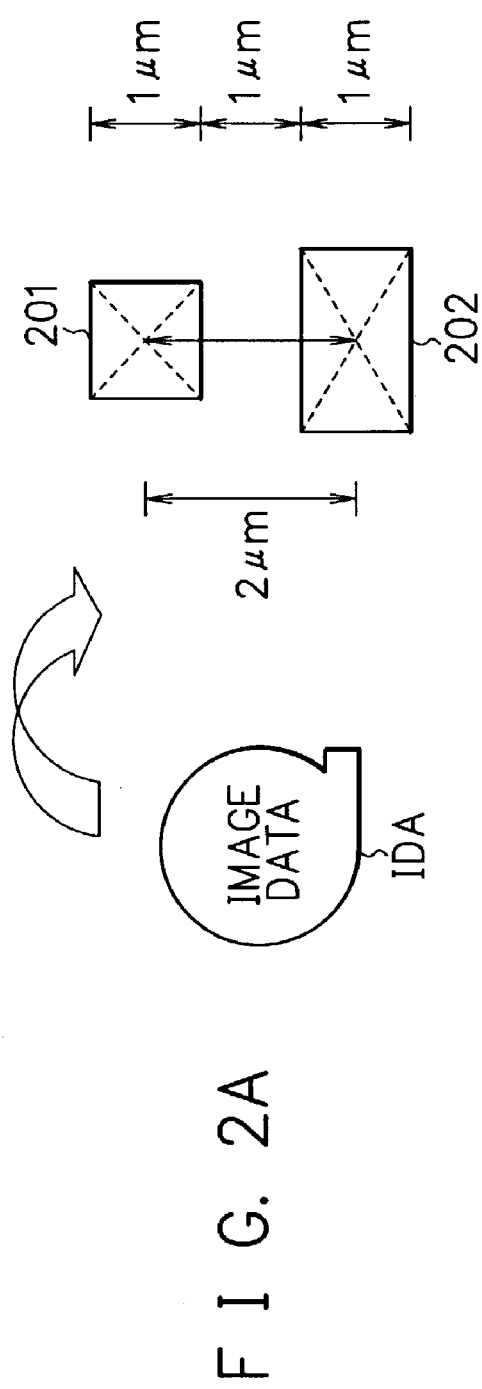
FIGS. 2A and 2B are views illustrating the processing by a magnification setting unit.

FIG. 1 is a diagram showing the configuration of a pattern image comparison device according to a first embodiment of the present invention. CAD data 101 that are design data for a reticle mask or semiconductor device are generated by CAD (computer-aided design). A converter 103 generates manufacturing data 104 based on the CAD data 101 and a parameter 102. A reticle aligner 105 draws a pattern on a reticle mask 106 with an electron beam based on the manufacturing data 104. The pattern image comparison device compares an original pattern of the manufacturing data 104 and the pattern on the reticle mask 106 to determine acceptance or non-acceptance of the pattern on the reticle mask 106. The following description will be made on a method thereof.

Through use of a SEM (scanning electron microscope) 107, two methods can be selectively used to generate image data IDB or image data IDC on the reticle mask 106. In a first method, the SEM 107 converts the optical pattern on the reticle mask 106 into the electrical image data IDB. In a second method, a photograph 110 of the pattern on the reticle mask 106 observed in the SEM 107 is printed. Then, an image scanner 111 converts the pattern of the photograph 110 into the image data IDC. The SEM 107 may be a typical microscope as well. The image data IDB and the image data IDC are generated by different methods, but both are the image data on the reticle mask 106. The following description will be made on an example using the image data IDB.

A computer 113 performs the following processing. A processing unit 120 of the computer 113 has a magnification setting unit 121 and a converter 122 to set a magnification for the manufacturing data 104 and generate image data IDA. The image data IDA and the image data IDB are stored in the computer 113.

A processing unit 130 of the computer 113 has a bit mapping unit 131, a contrast controlling unit 132, a region setting unit 133, a magnification matching unit 134, and a pattern form checking unit 135. The bit mapping unit 131 converts the image data IDA and IDB into a bit map form. The contrast controlling unit 132 controls the contrast of the image data IDA and IDB into binary digital images. The region setting unit 133 sets regions for comparison in the image data IDA and IDB. The magnification matching unit 134 adjusts the magnifications of the respective image data to match the sizes of the patterns of the image data IDA and IDB. The pattern form checking unit 135 compares the design data pattern of the image data IDA and the reticle pattern of the image data IDB and outputs the determination of acceptance or non-acceptance of the pattern on the reticle mask 106.

Figure 2B:
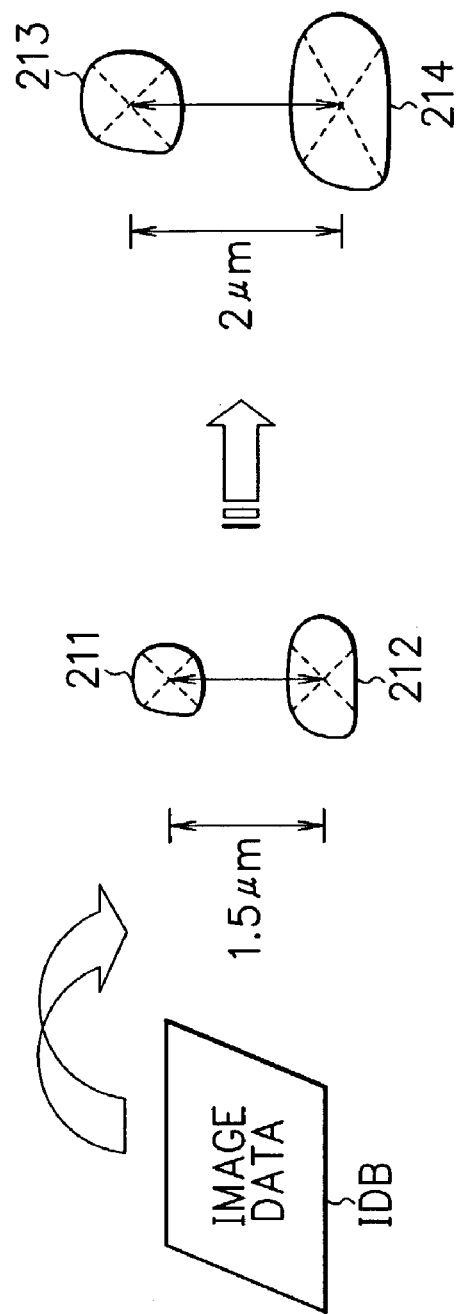

FIGS. 2A and 2B are diagrams showing processing by the magnification matching unit 134 in FIG. 1. FIG. 2A illustrates processing for the image data IDA, and FIG. 2B illustrates processing for the image data IDB.

In FIG. 2A, the image data IDA represent pattern image of the design data. When the pattern for comparison is a pattern 201, the pattern for comparison 201 and a pattern adjoining thereto 202 are extracted from the image data IDA. For example, the size of the pattern for comparison 201 is 1 μm, the size of the adjoining pattern 202 is 1 μm, and the distance between the patterns 201 and 202 is 1 μm. First, barycenters of the pattern for comparison 201 and the adjoining pattern 202 are obtained respectively, and the distance between the barycenters is then obtained. The distance between the barycenters is, for example, 2 μm.

In FIG. 2B, the image data IDB represent a pattern image of the reticle mask. When the pattern for comparison is a pattern 211, the pattern for comparison 211 and a pattern adjoining thereto 212 are extracted from the image data IDB. The patterns 211 and 212 here correspond to the patterns 201 and 202 in FIG. 2A. First, barycenters of the pattern for comparison 211 and the adjoining pattern 212 are obtained respectively, and the distance between the barycenters is then obtained. The distance between the barycenters is, for example, 1.5 μm. In this case, the distance between the barycenters in FIG. 2A (2 μm) does not match the distance between the barycenters in FIG. 2B (1.5 μm). This means that the patterns 201 and 211 do not match in size, and thus they cannot be compared each other. Hence, the magnifications of the patterns 211 and 212 are adjusted. For example, the patterns 211 and 212 are enlarged until the distance between the barycenters becomes 2 μm to obtain patterns 213 and 214. This completes the magnification matching, allowing comparison between the patterns 201 and 213. It should be noted that the patterns 202 and 214 are used only for the magnification matching.

Figures 3A, 3B, 3C:
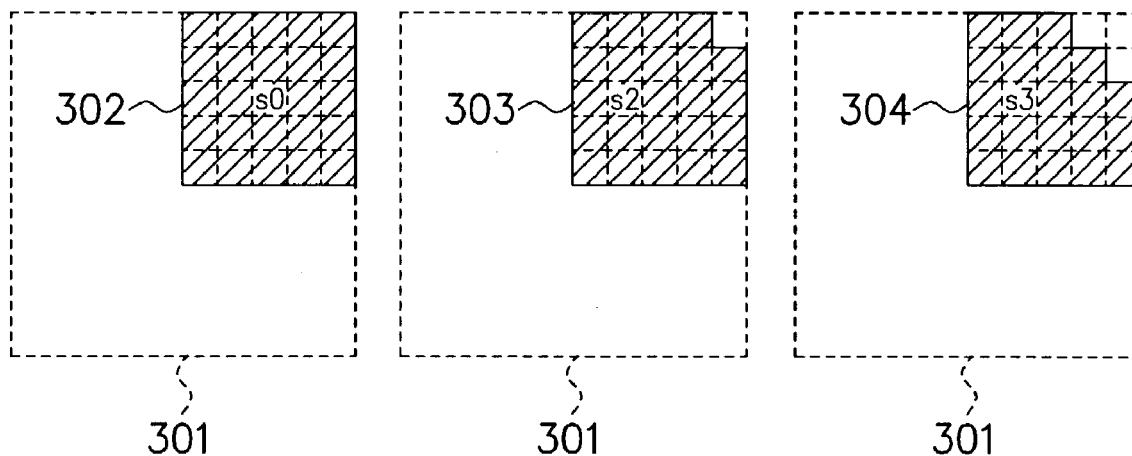
FIGS. 3A to 3C are views illustrating the processing by a pattern form checking unit.

FIGS. 3A to 3C are views illustrating processing by the pattern form checking unit 135 in FIG. 1. FIG. 3A shows a pattern 301 of the image data IDA of the design data. It is possible to set an arbitrary region of the pattern 301 as a region for comparison 302. For example, the region for comparison 302 can be set at a corner of the pattern 301 and, other than that, in a hole, a line and the like. Description will be made here on an example in which comparison is performed based on an area s0 of the region for comparison 302. The area s0 of the region for comparison 302 is, for example, 25 pixels.

FIGS. 3B and 3C show regions for comparison 303 and 304 of the image data IDB on the reticle mask. The case of FIG. 3B, in which an area s2 of the region for comparison 303 is, for example, 24 pixels which is less only by one pixel than the area s0 (25 pixels), can be determined as acceptable. The case of FIG. 3C, in which an area s3 of the region for comparison 304 is, for example, 22 pixels which is less by three pixels than the area s0 (25 pixels), can be determined as unacceptable. More specifically, a determination of acceptance shall be made when the difference between the area s0 of the region for comparison 302 in the image data of the design data and the area s2 or s3 of the region for comparison 303 or 304 in the image data of the reticle mask falls within a predetermined tolerance. While the determination of acceptance or non-acceptance can be made generally by the method of comparing areas, inconvenience may occur in some cases as shown in FIGS. 4A and 4B.

Figures 4A, 4B:
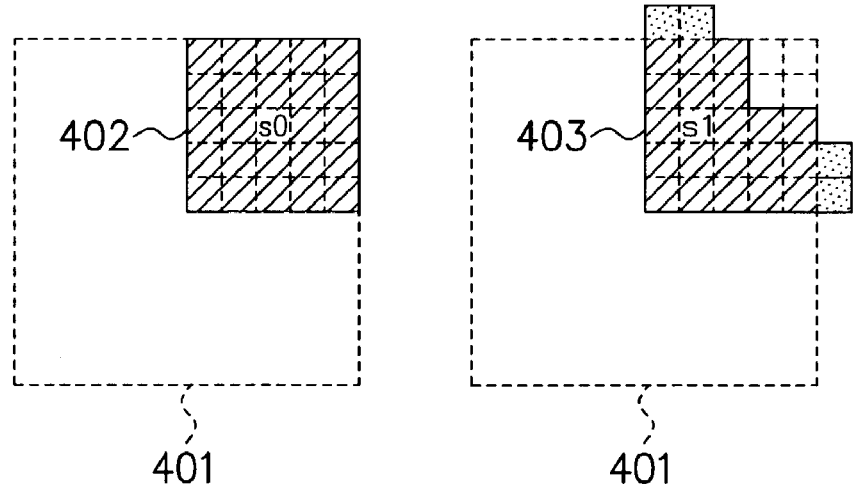
FIGS. 4A and 4B are views illustrating the processing of comparing areas of two pattern images.

FIG. 4A shows a pattern 401 of the image data IDA of the design data. A region for comparison 402 in the pattern 401 has an area s0, for example, 25 pixels. FIG. 4B shows a region for comparison 403 in the image data IDB on the reticle mask. The region for comparison 403 has an area s1 of, for example, 25 pixels. While both the areas S0 and s1 are the same 25 pixels, the regions for comparison 402 and 403 are considerably different in form, and thus this case should be determined as unacceptable. A method for solving this inconvenience is shown in FIGS. 5A to 5D.

FIG. 5A shows a pattern 500 of the image data IDA of the design data. A comparison is made here using two parameters, area and outer periphery. The pattern 500 has, for example, an area s1 of 25 pixels and an outer periphery d1 of 10. The outer periphery d1 is the length of sides of pixels on the outer periphery. Now, a case is considered here in which the image data IDB on the reticle mask is the same in form as the pattern 500. In this case, the following form factor K is obtained using area and outer periphery.

K=(the are of the image data IDB/the area of the image data IDA)×(the outer periphery of the image data IDB/the outer periphery of the image data IDA)

$$= (25/25) \times (10/10)$$

$$= 1$$

The closer to 1 the form factor K is, the higher the matching rate of the pattern of the image data IDA and the pattern of the image data IDB is. The comparison of the image data IDA and IDB using the two parameters, area and outer periphery, as described above enables an adequate determination of acceptance or non-acceptance even in the case of the pattern in FIG. 4B. More specifically, a determination of acceptance shall be made when a difference of the value of the above form factor K from 1 falls within a predetermined tolerance.

FIG. 5B shows a pattern 501 of the image data IDB on the reticle mask. The pattern 501 has, for example, an area s2 of 25 pixels and an outer periphery d2 of 12. The patterns 500 and 501 are different only in outer periphery. In this case, the following form factor K can be obtained using the area s2 and the outer periphery d2.

$$K = (s2/s1) \times (d2/d1)$$
$$= (25/25) \times (12/10)$$
$$= 1.2$$

FIG. 5C shows another pattern 502 of the image data IDB on the reticle mask. The pattern 502 has, for example, an area s3 of 24 pixels and an outer periphery d3 of 10. The patterns 500 and 502 are different only in area. In this case, the following form factor K can be obtained using the area s3 and the outer periphery d3.

$$K = (s3/s1) \times (d3/d1)$$
$$= (24/25) \times (10/10)$$
$$= 0.96$$

FIG. 5D shows another pattern 503 of the image data IDB on the reticle mask. The pattern 503 has, for example, an area s4 of 15 pixels and an outer periphery d4 of 8. The patterns 500 and 503 are different in area and outer periphery. In this case, the following form factor K can be obtained using the area s4 and the outer periphery d4.

$$K = (s4/s1) \times (d4/d1)$$
$$= (15/25) \times (8/10)$$
$$= 0.48$$

Next, referring to FIGS. 6A to 6D, another method for obtaining the outer periphery will be described. In FIGS. 5A to 5D, the length of sides of the pixels on the outer periphery is regarded as the outer periphery. In FIGS. 6A to 6D, the number of pixels on the pouter periphery is regarded as the outer periphery. The patterns in FIGS. 6A to 6D are the same as those in FIGS. 5A to 5D respectively.

FIG. 6A shows a pattern 600 of the image data IDA of the design data. The pattern 600 has, for example, an area s5 of 25 pixels and an outer periphery d5 of 9. The outer periphery d5 is the number of pixels on the outer periphery. Now, a case is considered in which the image data IDB on the reticle mask are the same in form as the pattern 600. In this case, the following form factor K is obtained using area and outer periphery.

K=(the are of the image data IDB/the area of the image data IDA)×(the outer periphery of the image data IDB/the outer periphery of the image data IDA)

$$= (25/25) \times (9/9)$$
$$= 1$$

The closer to 1 the form factor K is, the higher the matching rate of the pattern of the image data IDA and the pattern of the image data IDB is. The method shown in FIGS. 6A to 6D is effective when the resolution of the image is high.

FIG. 6B shows a pattern 601 of the image data IDB on the reticle mask. The pattern 601 has, for example, an area s6 of 25 pixels and an outer periphery d6 of 8. In this case, the following form factor K can be obtained using the area s6 and the outer periphery d6.

$$K = (s6/s5) \times (d6/d5)$$
$$= (25/25) \times (8/9)$$
$$= 0.88$$

FIG. 6C shows another pattern 602 of the image data IDB on the reticle mask. The pattern 602 has, for example, an area s7 of 24 pixels and an outer periphery d7 of 8. In this case, the following form factor K can be obtained using the area s7 and the outer periphery d7.

$$K = (s7/s5) \times (d7/d5)$$
$$= (24/25) \times (8/9)$$
$$= 0.84$$

FIG. 6D shows another pattern 603 of the image data IDB on the reticle mask. The pattern 603 has, for example, an area s8 of 15 pixels and an outer periphery d8 of 6. In this case, the following form factor K can be obtained using the area s8 and the outer periphery d8.

$$K = (s8/s5) \times (d8/d5)$$
$$= (15/25) \times (6/9)$$
$$= 0.39$$

Figure 7:
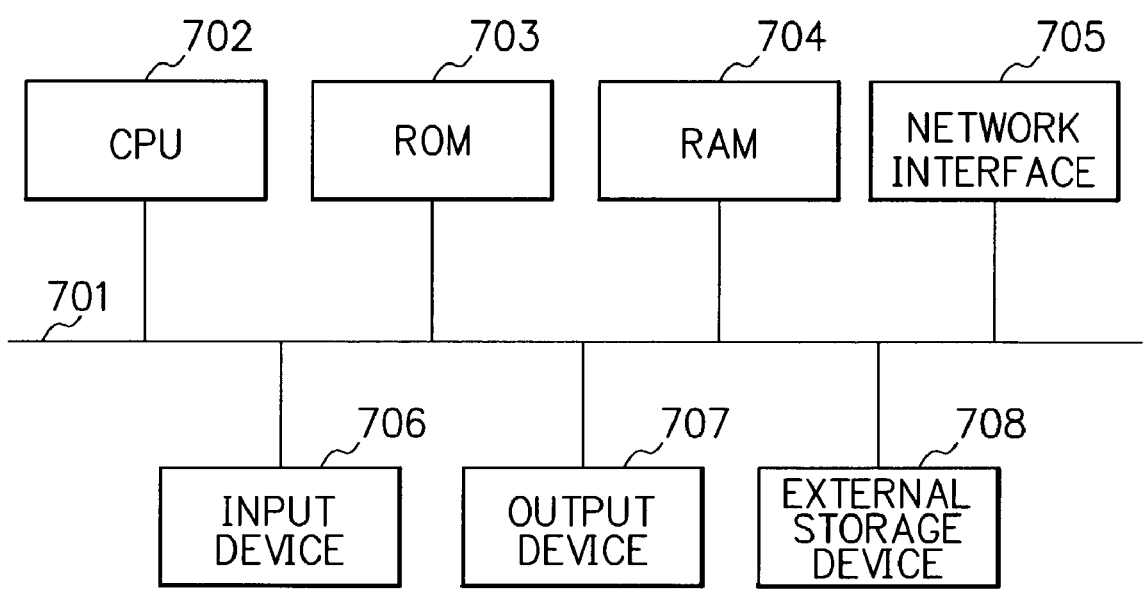
FIG. 7 is a configuration diagram showing hardware of a computer.

FIG. 7 is a configuration diagram of hardware of the computer 113 in FIG. 1. A bus 701 is connected with a central processing unit (CPU) 702, a ROM 703, a RAM 704, a network interface 705, an input device 706, an output device 707, an external storage device The CPU 702 processes and calculates data and controls the above component units connected via the bus 701. The ROM 703 previously stores a boot program, so that the CPU 702 executes the boot program to boot up the computer. The external storage device 708 stores a computer program, which is copied in the RAM 704 and executed by the CPU 702. The computer executes the computer program to perform the later-described processing in the flowchart in FIG. 8 and so on.

The external storage device 708 is, for example, a hard disk storage device or the like, and thus its storage contents are not lost even if the power is turned off. The external storage device 708 can record on a recording medium the computer program, image data, and so on, and read from the recording medium the computer program, image data, and so on.

The network interface 705 can input into and output from a network the computer program, image data, and so on. The input device 706 that is, for example, a keyboard, a pointing device (mouse), and the like can perform various kinds of designation, input, and so on. The output device 707 is a display, a printer, and the like.

Figure 8:
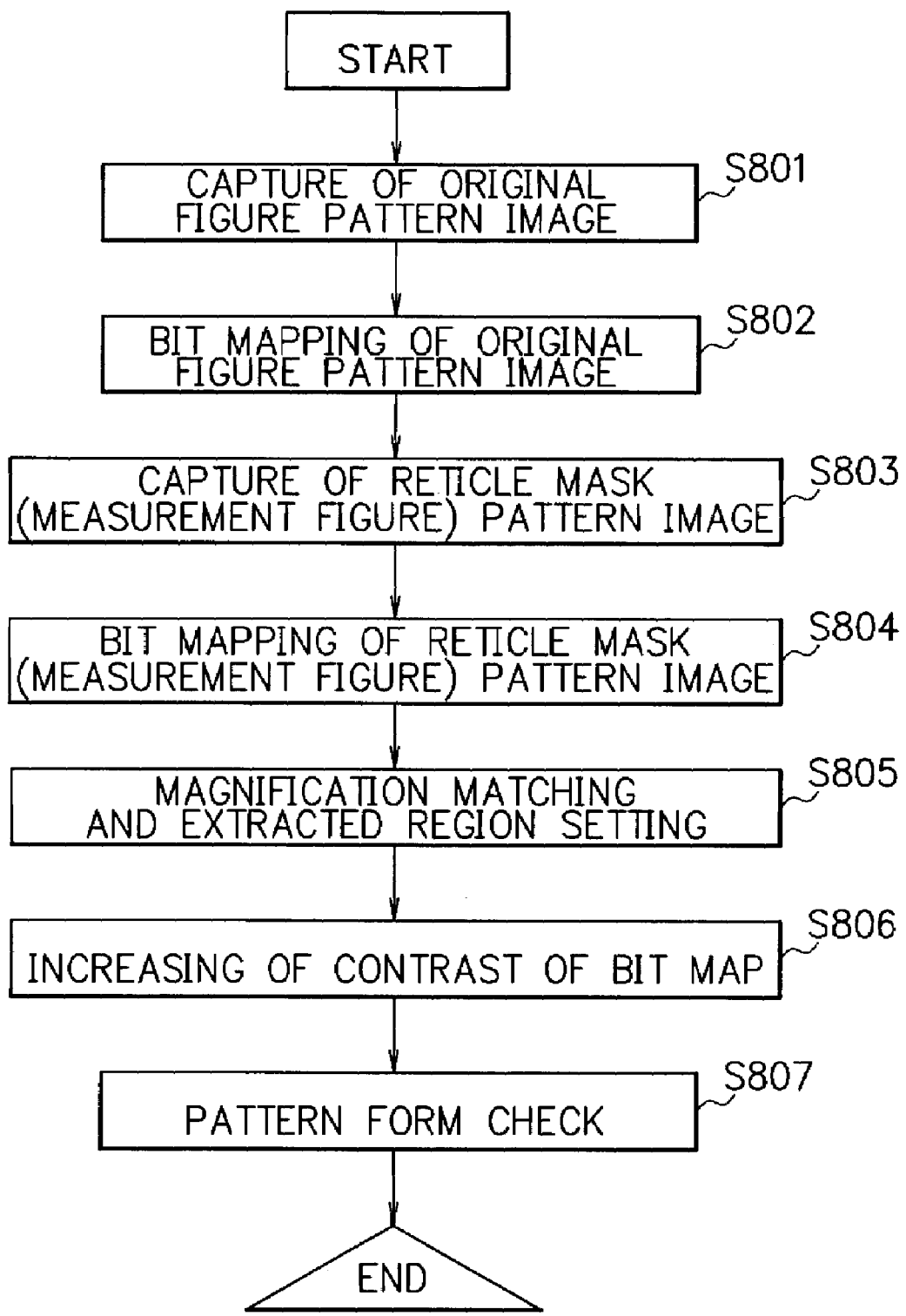
FIG. 8 is a flowchart showing the processing performed by the computer.

FIG. 8 is a flowchart showing the processing executed by the computer 113 in FIG. 1. In Step S801, the image data IDA of the design data pattern (hereafter, referred to as an original figure pattern) are captured and recorded in the external storage device 708. Then, in Step S802, the image data IDA of the original figure pattern are converted into a bit map form. Then, in Step S803, the image data IDB on the reticle mask pattern (hereafter, referred to as a measurement figure pattern) are captured and recorded in the external storage device 708. Then, in Step S804, the image data IDB of the measurement figure pattern are converted into a bit map form. Then, in Step S805, magnification matching and extracted region setting are performed for the image data IDA and IDB. The magnification matching is the processing shown in FIGS. 2A and 2B. The extracted region setting is the processing of setting the region for comparison 302 in the pattern 301 in FIG. 3A. Then, in Step s806, the image data IDA and IDB in the bit map form are increased in contrast for conversion into binary digital images. Then, in Step S807, pattern form check processing is performed. The pattern form check processing that is the processing shown in FIGS. 5A to 5D and so on, compares the image data IDA with IDB and outputs a determination of acceptance or non-acceptance of the image data IDB on the reticle pattern.

FIGS. 9A and 9B are views for explaining a specific example of the processing in FIG. 8. FIG. 9A illustrates an original figure pattern 901 of the image data IDA. The original figure pattern 901 is, for example, a square. FIG. 9B illustrates a measurement figure pattern 902 of the image data IDB. The measurement figure pattern 902 is rounded at corner portions as compared to the original figure pattern 901. The measurement figure pattern 902 is likely to deform at the corner portions, and thus a region for comparison 903 is set at the corner portion. For the region for comparison 903, the original figure pattern 901 and the measurement figure pattern 902 are compared.

FIGS. 10A and 10B are views for explaining another specific example of the processing in FIG. 8. FIG. 10A illustrates an original figure pattern 1001 of the image data IDA. The original figure pattern 1001 is, for example, a square with auxiliary patterns existing at corner portions. FIG. 10B illustrates a measurement figure pattern 1002 of the image data IDB. The measurement figure pattern 1002 is rounded at the corner portions as compared to the original figure pattern 1001. The measurement figure pattern 1002 is likely to deform at the auxiliary portions, and thus a region for comparison 1003 is set at the auxiliary portion. For the region for comparison 1003, the original figure pattern 1001 and the measurement figure pattern 1002 are compared.

Figure 11:
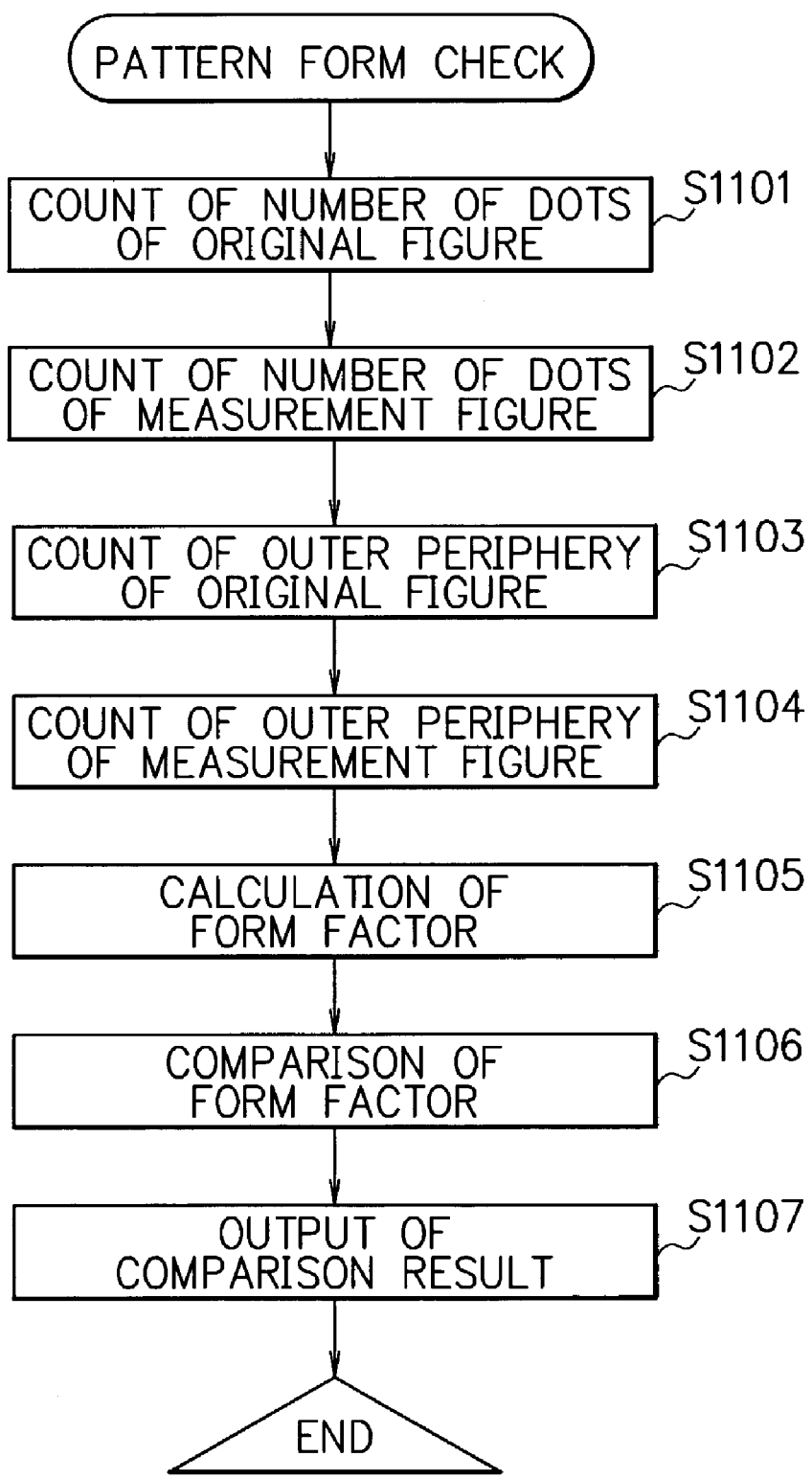
FIG. 11 is a flowchart showing details of pattern form check processing.

FIG. 11 is a flowchart showing details of the pattern form check processing in Step S807 in FIG. 8. In Step S1101, the number of dots (pixels) of the original figure pattern is counted to calculate the area of the original figure pattern. Then, in Step S1102, the number of dots (pixels) of the measurement figure pattern is counted to calculate the area of the measurement figure pattern. Then, in Step S1103, the outer periphery of the original figure pattern is counted. Then, in Step S1104, the outer periphery of the measurement figure pattern is counted. Then, in Step S1105, the above-described form factor K is obtained based on the calculated areas and outer peripheries. Then, in Step S1106, the calculated form factor K and a threshold value are compared to check whether the form factor K falls within a tolerance. Then, in Step S1107, the above comparison result is outputted. For example, the determination of acceptance or non-acceptance of the reticle mask is outputted to the output device 707.

Description will be made on the case in FIGS. 9A and 9B. For example, the original figure pattern 901 had an area of 49220 and an outer periphery of 887. The measurement figure pattern 902 had an area of 44298 and an outer periphery of 826. As a result, the form factor K was 0.837. The form of the pattern image can be converted into numeric values, leading to easy evaluation.

Second Embodiment

FIG. 12A is a flowchart showing details of pattern form check processing according to a second embodiment of the present invention. The pattern form check processing is the processing in Step S807 in FIG. 8. First, in Step S1201, the measurement figure pattern is reduced (minus-sized or minus-scaled). Then, in Step S1202, the once reduced measurement figure pattern is enlarged (plus-sized or plus-scaled) back into the original size. Hereafter, processing in Steps S1203 to S1209 is performed. The processing in Steps S1203 to S1209 is the same as that in Steps S1101 to S1107 in FIG. 11. This processing will be described in detail with reference to FIGS. 13A and 13B.

Figure 13A:
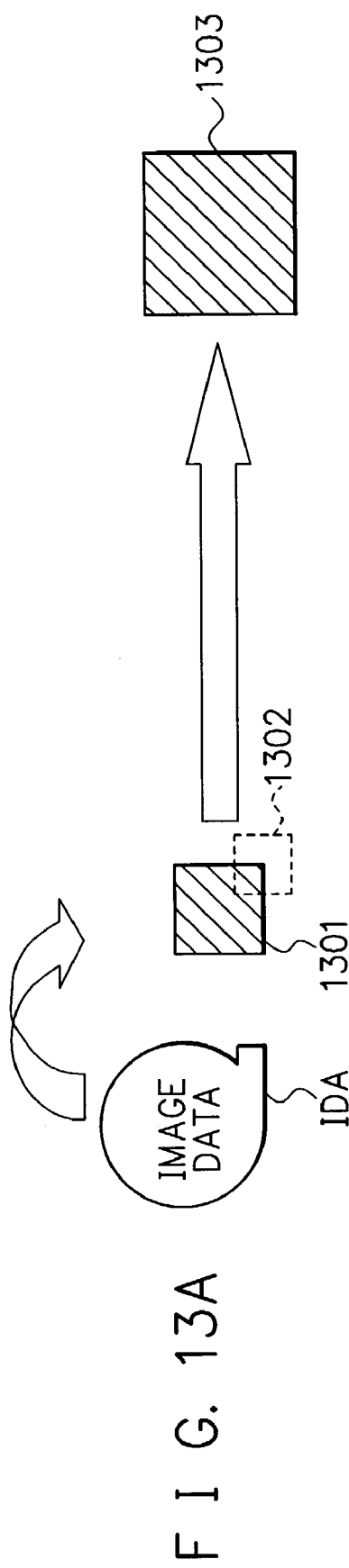
FIGS. 13A and 13B are views for explaining a specific example of the processing in FIG. 12A.
Figure 13B:
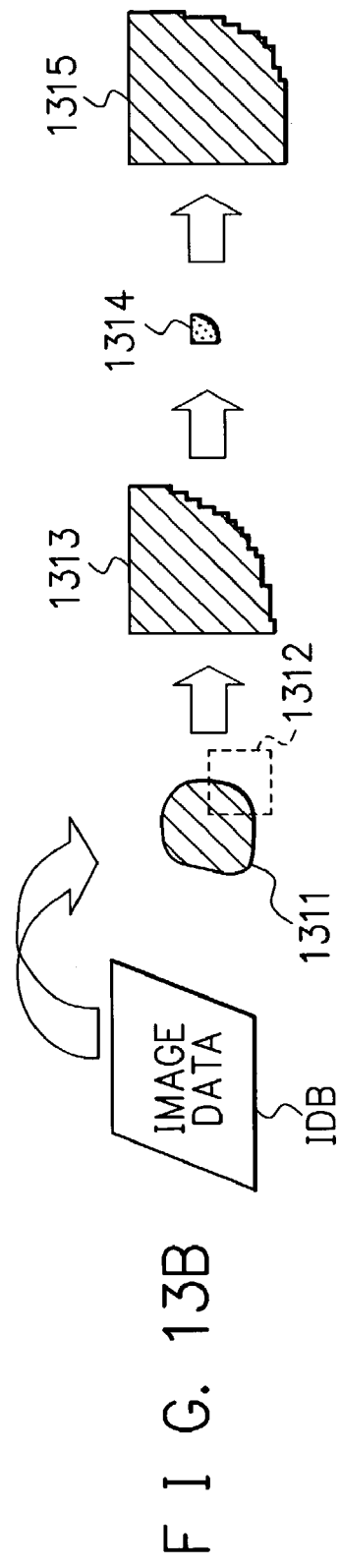

FIG. 13A illustrates processing for the image data IDA, and FIG. 13B illustrates processing for the image data IDB.

In FIG. 13A, a pattern 1301 is extracted from the image data IDA, and a region for comparison 1302 is set in the pattern 1301. A pattern 1303 in the region for comparison 1302 becomes an object to be compared.

On the other hand, in FIG. 13B, a pattern 1311 is extracted from the image data IDB, and a region for comparison 1312 is set in the pattern 1311. Then, a pattern 1313 in the region for comparison 1312 is reduced by a predetermined sizing amount to generate a pattern 1314. Then, the pattern 1314 is enlarged by the same sizing amount to generate a pattern 1315. The patterns 1313 and 1315 are the same in size but not always completely the same in form. The pattern 1315 has a spatial high-frequency component removed as compared to the pattern 1313. The comparison of the measurement figure pattern 1315 after processing and the original figure pattern 1303 enables comparison of rough forms.

FIG. 14A shows an example of a large sizing amount for reduction and enlargement. A pattern 1401 is reduced by a large sizing amount to generate a pattern 1402, which is enlarged to generate a pattern 1403. AS a result, the measurement figure pattern 1403 becomes a square, the same as the original figure pattern.

On the other hand, FIG. 14B shows an example of a small sizing amount for reduction and enlargement. A pattern 1411 is reduced by a small sizing amount to generate a pattern 1412, which is enlarged to generate a pattern 1413. AS a result, the measurement figure pattern 1413 becomes not a square but a form different from the original figure pattern. The sizing amount is adjusted as described above to enable the tolerance in form comparison to be adjusted. In this case, a determination of acceptance is made when a difference of the form factor K to the measurement figure pattern after reduction and enlargement by a predetermined sizing amount from 1 falls within a predetermined tolerance.

While the description has been made on the processing in FIG. 12A with the sizing amount or the scaling amount being fixed, a method with the sizing amount or the scaling amount being variable will be described with reference to FIG. 12B.

FIG. 12B is a flowchart showing details of another pattern form check processing in Step 807 in FIG. 8. First, in Step S1211, the measurement figure pattern is reduced (minus-sized or minus-scaled). Then, in Step S1212, the once reduced measurement figure pattern is enlarged (plus-sized or plus-scaled) back into the original size. Then, in Step S1213, the areas and the outer peripheries of the original figure pattern and the measurement figure pattern are obtained to calculate the form factor K. Then, in Step S1214, whether the form factor K falls within the tolerance (about 1) is checked, that is, whether the original figure pattern and the measurement figure pattern substantially match is checked. When there is a substantial match, the processing proceeds to Step S1215, and otherwise the processing returns to Step S1211. The reduced and enlarged measurement figure pattern is further reduced and enlarged by the same amount, and the measurement figure pattern substantially matches the original figure pattern at last. When there is a substantial match, the processing proceeds to step S1215. In Step S1215, the total sizing amount or the total scaling amount is calculated. Then, in Step S1216, a determination of acceptance or non-acceptance is outputted based on the total sizing amount or the total scaling amount. More specifically, a determination of acceptance is made when the total sizing amount or the total scaling amount, which is required for the measurement figure pattern to match the original figure pattern within the predetermined tolerance, is smaller than a predetermined reference value. In this case, the comparison result is outputted in accordance with the matching rate of the original figure pattern and the measurement figure pattern and the sizing amount (or the scaling amount).

Third Embodiment

Figure 15:
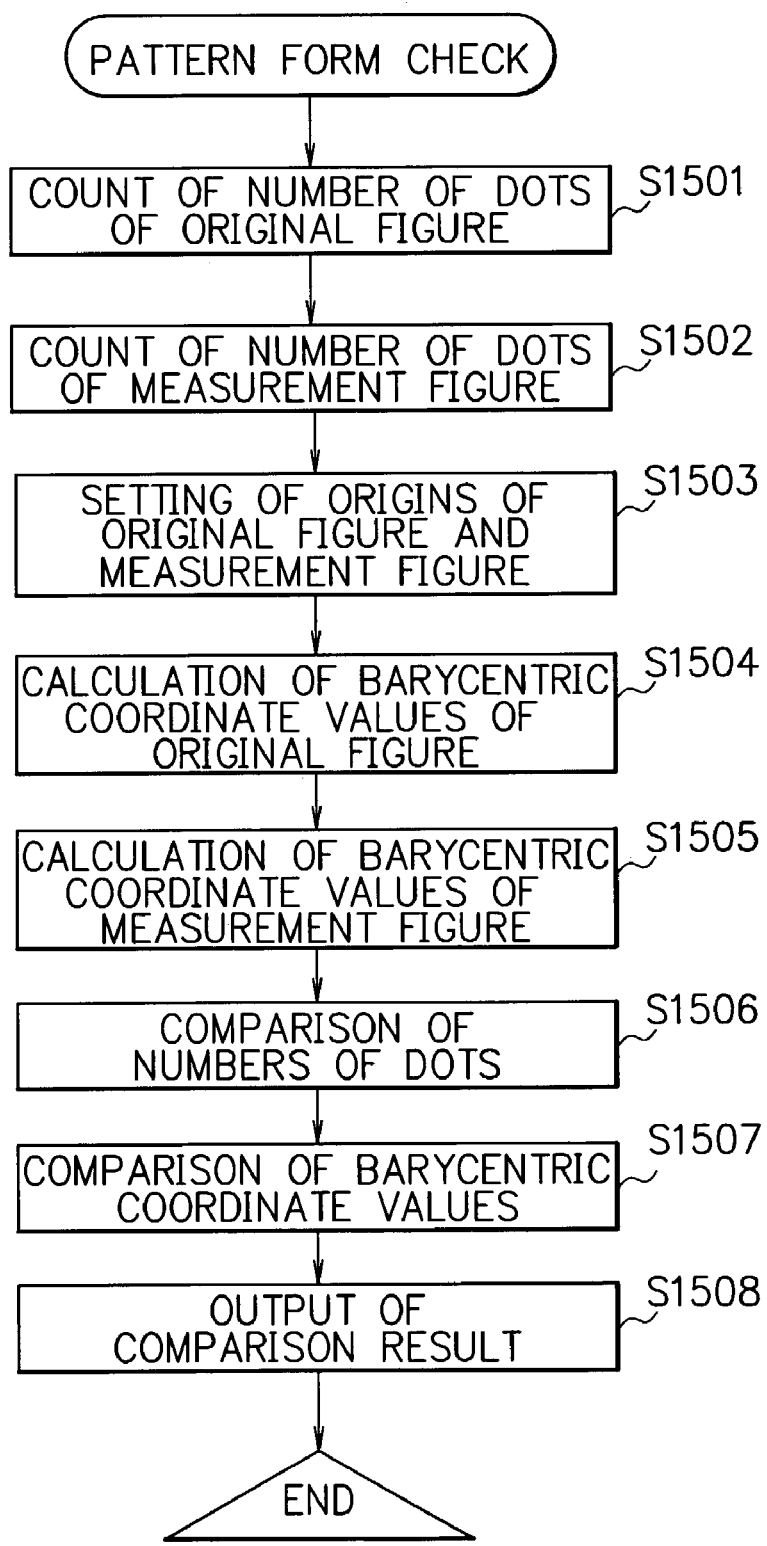
FIG. 15 is a flowchart showing details of pattern form check processing according to a third embodiment of the present invention.

FIG. 15 is a flowchart showing details of another pattern form check processing according to a third embodiment of the present invention. The pattern form check processing is the processing in Step S807 in FIG. 8. First, in Step S1501, the number of dots (pixels) of the original figure pattern is counted to calculate the area of the original figure pattern. Then, in Step S1502, the number of dots (pixels) of the measurement figure pattern is counted to calculate the area of the measurement figure pattern. Then, in Step S1503, to obtain barycentric coordinates, coordinates of origins of the original figure pattern and the measurement figure pattern are set. Then, in Step S1504, the barycentric coordinate values of the original figure pattern are calculated. Then, in Step S1505, the barycentric coordinate values of the measurement figure pattern are calculated. Then, in Step S1506, the areas (the numbers of dots) of the original figure pattern and the measurement figure pattern are compared. Then, in Step S1507, the barycentric coordinate values of the original figure pattern and the measurement figure pattern are compared. Then, in Step S1508, the result of form comparison of the original figure pattern and the measurement figure pattern is outputted in accordance with the result of the above comparison regarding area and barycentric coordinate value. This processing will be described in detail hereafter.

Figure 16A:
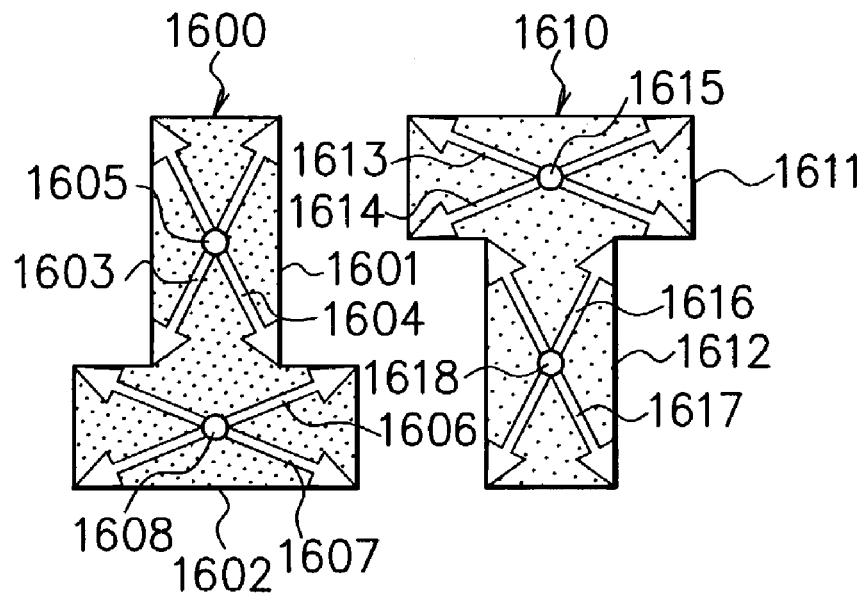
FIGS. 16A and 16B are views for explaining a specific example of the processing in FIG. 15.
Figure 16B:
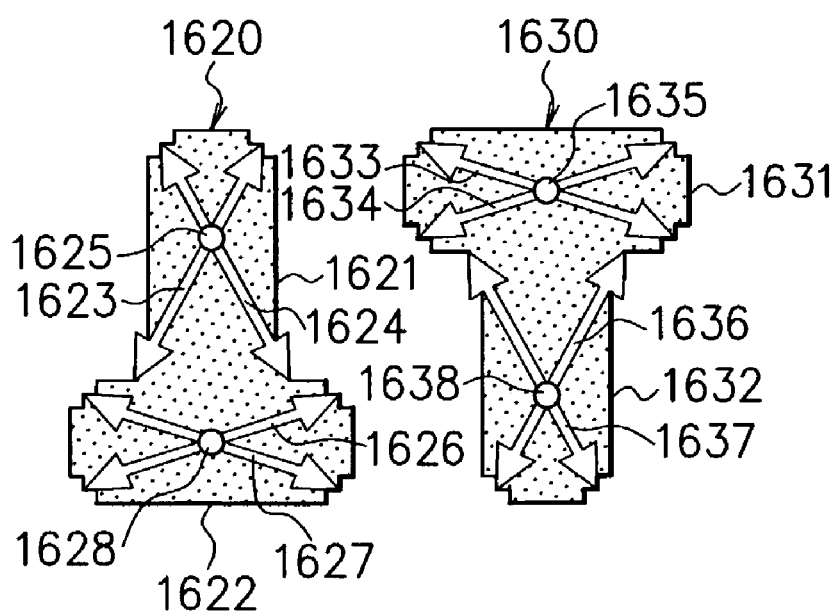

FIG. 16A shows original figure patterns 1600 and 1610, and FIG. 16B shows measurement figure patterns 1620 and 1630 corresponding thereto.

In FIG. 16A, the original figure pattern 1600 has patterns 1601 and 1602. Description will be made on a method of calculating barycenters of the patterns 1601 and 1602. First, diagonal lines 1603 and 1604 connecting vertices of the pattern 1601 are obtained. Then, an intersection point of the diagonal lines 1603 and 1604 is obtained as a barycenter 1605. Similarly, an intersection point of diagonal lines 1606 and 1607 of the pattern 1602 is obtained as a barycenter 1608. Besides, the original figure pattern 1610 has patterns 1611 and 1612. First, an intersection point of diagonal lines 1613 and 1614 of the pattern 1611 is obtained as a barycenter 1615. Then, an intersection point of diagonal lines 1616 and 1617 of the pattern 1612 is obtained as a barycenter 1618. For example, the original figure pattern 1600 has an area of 440 pixels, with the pattern 1601 having the barycenter 1605 at coordinates (19, 26) and the pattern 1602 having the barycenter 1608 at coordinates (19, 17). Besides, the original figure pattern 1610 has an area of 440 pixels, with the pattern 1611 having the barycenter 1615 at coordinates (44, 31) and the pattern 1612 having the barycenter 1618 at coordinates (44, 21).

As described above, when the pattern 1600 composed of, for example, a plurality of rectangular patterns 1601 and 1602, the pattern 1600 is divided into the rectangular patterns. Then, barycenters of the rectangular patterns are obtained.

In FIG. 16B, the measurement figure pattern 1620 has patterns 1621 and 1622. First, an intersection point of diagonal lines 1623 and 1624 of the pattern 1621 is obtained as a barycenter 1625. Then, an intersection point of diagonal lines 1626 and 1627 of the pattern 1622 is obtained as a barycenter 1628. Besides, the measurement figure pattern 1630 has patterns 1631 and 1632. First, an intersection point of diagonal lines 1633 and 1634 of the pattern 1631 is obtained as a barycenter 1635. Then, an intersection point of diagonal lines 1636 and 1637 of the pattern 1632 is obtained as a barycenter 1638. For example, the measurement figure pattern 1620 has an area of 424 pixels, with the pattern 1621 having the barycenter 1625 at coordinates (19, 28) and the pattern 1622 having the barycenter 1628 at coordinates (19, 17). Besides, the original figure pattern 1630 has an area of 424 pixels, with the pattern 1631 having the barycenter 1635 at coordinates (44, 31) and the pattern 1632 having the barycenter 1638 at coordinates (44, 15).

It should be noted that while the comparison is made regarding area and barycentric coordinates in the foregoing, a comparison may be made regarding area and lengths of a diagonal lines as well. For example, in FIG. 16A, the original figure pattern 1600 has the area of 440 pixels, and the pattern 1601 has the diagonal line 1603 having a length of 24 and the diagonal line 1604 having a length of 24. Besides, the original figure pattern 1610 has the area of 440 pixels, and the pattern 1611 has the diagonal line 1613 having a length of 24 and the diagonal line 1614 having a length of 24.

On the other hand, in FIG. 16B, the measurement figure pattern 1620 has the area of 424 pixels, and the pattern 1621 has the diagonal line 1623 having a length of 21 and the diagonal line 1624 having a length of 21. Besides, the measurement figure pattern 1630 has the area of 424 pixels, and the pattern 1631 has the diagonal line 1633 having a length of 21 and the diagonal line 1634 having a length of 21.

Figure 17A:
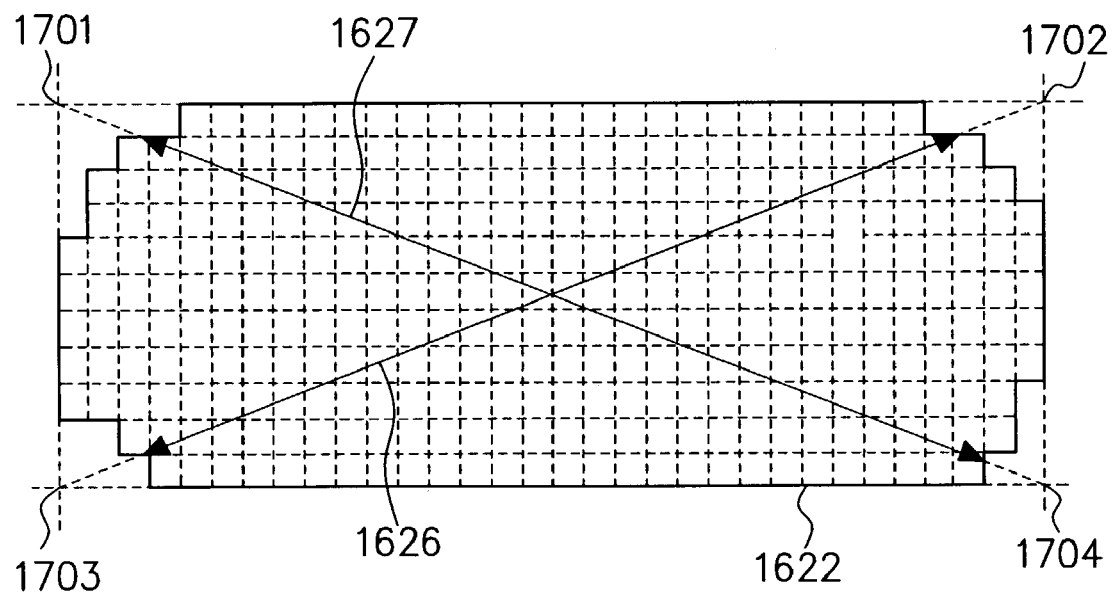
FIGS. 17A and 17B are diagrams for explaining a method for calculating diagonal lines.

FIG. 17A is a diagram for explaining a method for calculating the diagonal lines 1626 and 1627 in FIG. 16B. First, the pattern 1622 is regarded as a quadrangle (rectangular), and four intersection points of extensions of respective sides are set as vertices 1701 to 1704. Then, the diagonal lines 1626 and 1627 are drawn to connect the four vertices 1701 to 1704. The lengths of the diagonal lines 1626 and 1627 are the length from one end to the other end of the pattern 1622.

Figure 17B:
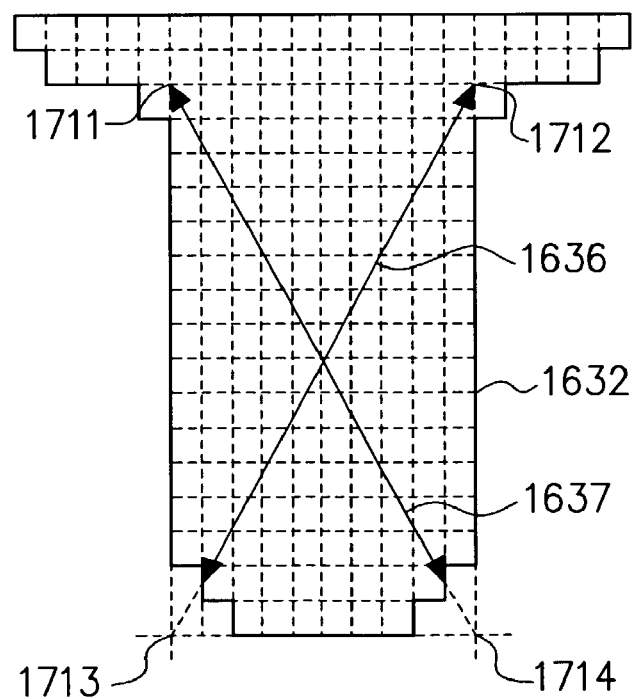

FIG. 17B is a diagram for explaining the method for calculating the diagonal lines 1636 and 1637 in FIG. 16B. First, the pattern 1632 is regarded as a quadrangle (rectangular), and four intersection points of extensions of respective sides are set as vertices 1711 to 1714. Then, the diagonal lines 1636 and 1637 are drawn to connect the four vertices 1711 to 1714. The lengths of the diagonal lines 1636 and 1637 are the length from one end to the other end of the pattern 1632.

The diagonal lines are calculated by the above method to compare the original figure pattern and the measurement figure pattern. The comparison based on area and barycentric coordinates (or length of diagonal lines) enables evaluation of the pattern form on a reticle mask. More specifically, a determination of acceptance is made when the difference in area and barycentric coordinate position (or length of diagonal lines) between the original figure pattern and the measurement figure pattern falls within a predetermined tolerance.

Fourth Embodiment

Figure 18A:
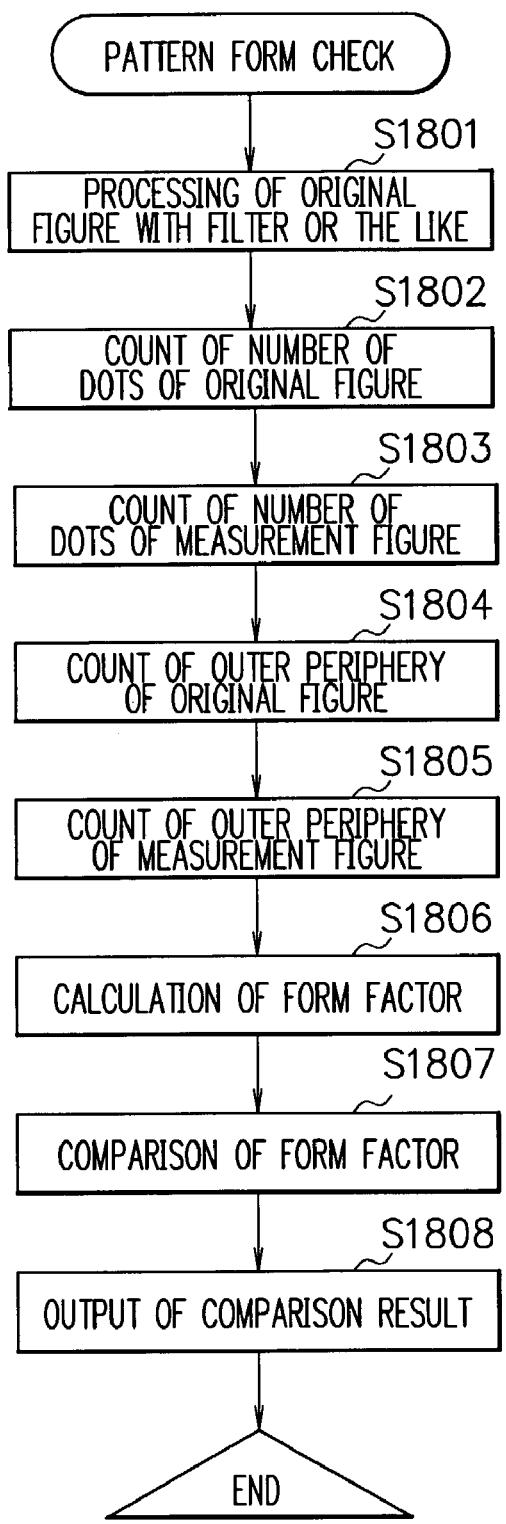
FIGS. 18A and 18B are flowcharts showing details of pattern form check processing according to a fourth embodiment of the present invention.

FIG. 18A is a flowchart showing details of pattern form check processing according to a fourth embodiment of the present invention. The pattern form check processing is the processing in Step S807 in FIG. 8. First, in Step S1801, the original figure pattern is processed with a filter or the like. Hereafter, processing in Steps S1802 to S1808 is performed. The processing in Steps S1802 to S1808 is the same as that in Steps S1101 to S1107 in FIG. 11. This embodiment differs from the second embodiment in that not the measurement figure pattern but the original figure pattern is processed. This processing will be described in detail with reference to FIGS. 19A and 19B.

Figure 19B:
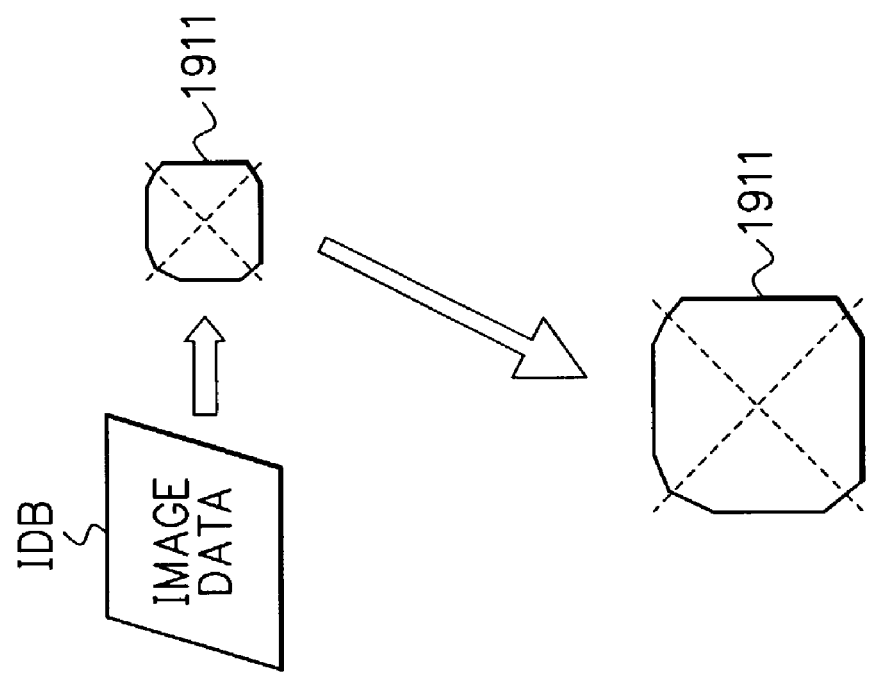
FIGS. 19A and 19B are views for explaining a specific example of the processing in FIG. 18A.
Figure 19A:
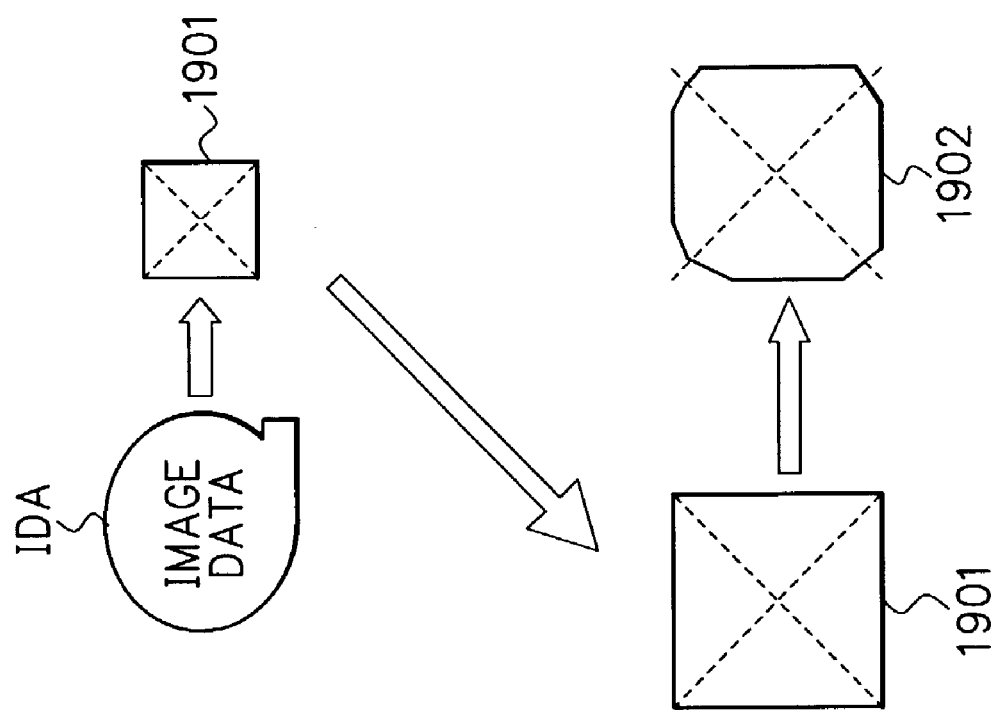

FIG. 19A illustrates processing for the image data IDA, and FIG. 19B illustrates processing for the image data IDB. In FIG. 19A, a pattern 1901 is first extracted from the image data IDA. Then, the pattern 1901 is processed with a filter or the like to generate a pattern 1902. The pattern 1902 becomes an object to be compared. In FIG. 19B, a pattern 1911 is extracted from the image data IDB. The pattern 1911 becomes an object to be compared. The comparison of the original figure pattern 1902 and the measurement figure pattern 1911 enables comparison of rough forms.

The aforementioned filter is preferably a filter having characteristics in consideration of the property of the electron beam which draws a pattern on a reticle mask. If it is difficult to process the measurement figure pattern closer to the original figure pattern, the original figure pattern is processed closer to the measurement figure pattern for a comparison of both and a determination of acceptance or non-acceptance. More specifically, a determination of acceptance is made when the difference of the form factor K to the original figure pattern which has been filtered by a predetermined processing amount of filtering from 1, falls within a predetermined tolerance.

While the description has been made on the processing in FIG. 18A with the processing amount with a filter being fixed, a method with the processing amount being variable will be described with reference to FIG. 18B. The processing in FIG. 18B corresponds to that in FIG. 12B.

Figure 18B:
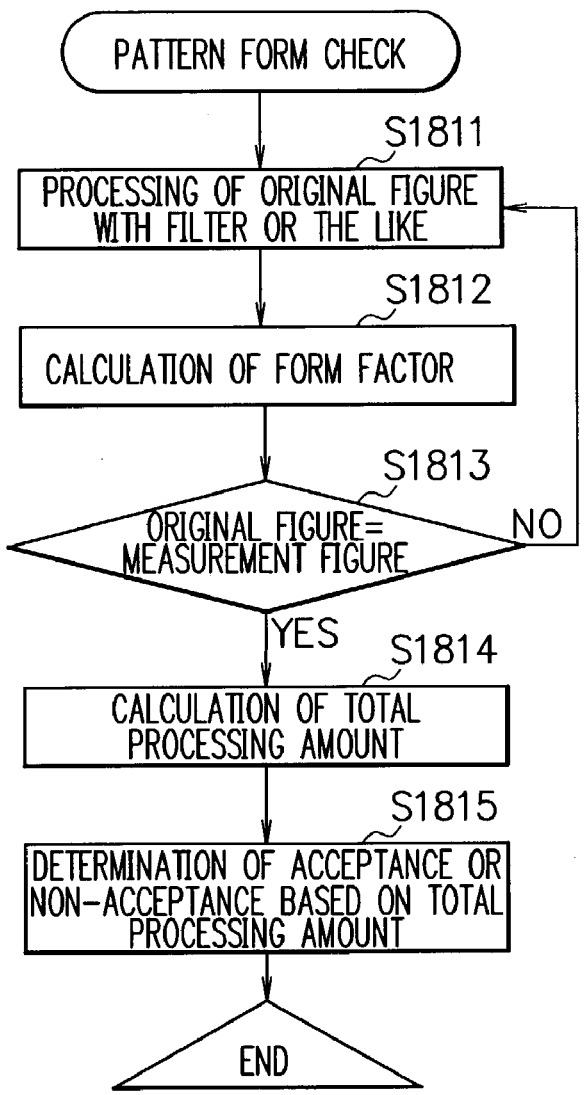

FIG. 18B is a flowchart showing details of another pattern form check processing in Step S807 in FIG. 8. First, in Step S1811, the original figure pattern is processed using a filter or the like. Then, in Step S1812, the areas and the outer peripheries of the original figure pattern and the measurement figure pattern are obtained to calculate the form factor K. Then, in Step S1813, whether the form factor K falls within the tolerance (about 1) is checked, that is, whether forms of the original figure pattern and the measurement figure pattern substantially match is checked. When there is a substantial match, the processing proceeds to Step S1814, and otherwise the processing returns to Step S1811. The processed original figure pattern is further processed by the same amount, and the original figure pattern substantially matches the measurement figure pattern at last. When there is a substantial match, the processing proceeds to step S1814. In Step S1814, the above total processing amount is calculated. Then, in Step S1815, a determination of acceptance or non-acceptance is outputted based on the total processing amount. In this case, the comparison result is outputted in accordance with the matching rate of the original figure pattern and the measurement figure pattern and the processing amount. More specifically, a determination of acceptance is made when the total processing amount, which is required for the original figure pattern to match the measurement figure pattern within the predetermined tolerance, is smaller than a predetermined reference value.

Fifth Embodiment

Figure 20:
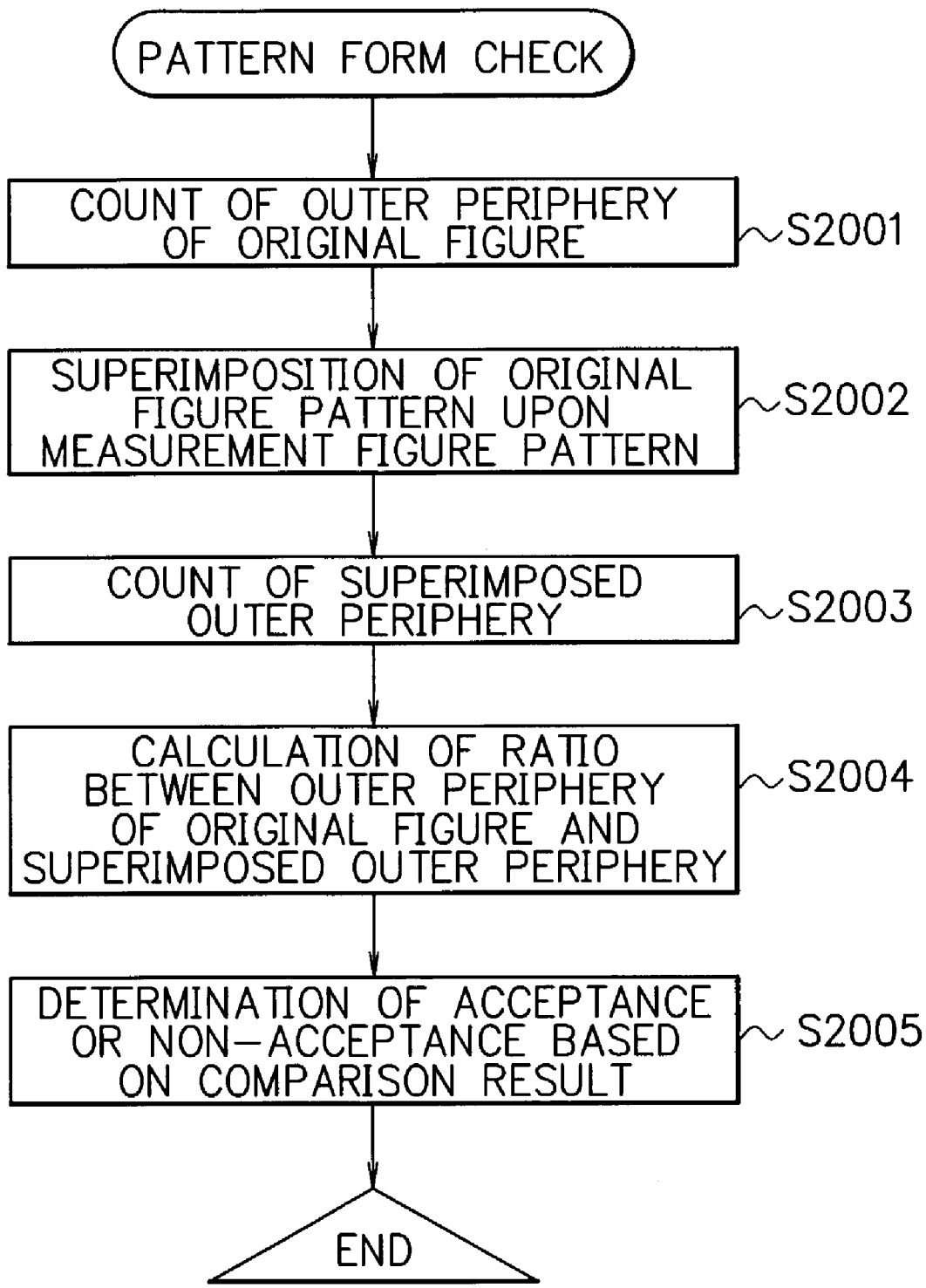
FIG. 20 is a flowchart showing details of pattern form check processing according to a fifth embodiment of the present invention.

FIG. 20 is a flowchart showing details of pattern form check processing according to a fifth embodiment of the present invention. The pattern form check processing is the processing in Step S807 in FIG. 8. First, in Step S2001, the number of pixels on the outer periphery of the original figure pattern is counted. Then, instep S2002, the original figure pattern and the measurement figure pattern are superimposed one upon the other. Then, in Step S2003, the number of pixels on the outer periphery of the original figure pattern superimposed upon the outer periphery of the measurement figure pattern, is counted. Then, in Step S2004, the ratio between the number of pixels on the outer periphery of the original figure pattern calculated in Step S2001 and the number of superimposed pixels on the outer periphery calculated in Step S2003, is calculated. Then, in Step S2005, a determination of acceptance or non-acceptance of the pattern on the reticle mask is outputted in accordance with the above ratio. The ratio is close to 1 within a predetermined tolerance is acceptable. This processing will be described in detail hereafter.

Figure 21A:
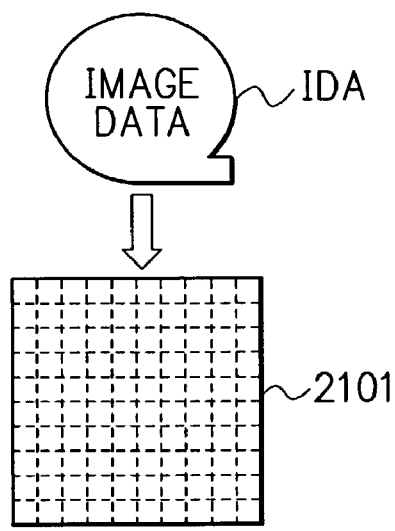
FIGS. 21A to 21E are views for explaining a specific example of the processing in FIG. 20.
Figure 21B:
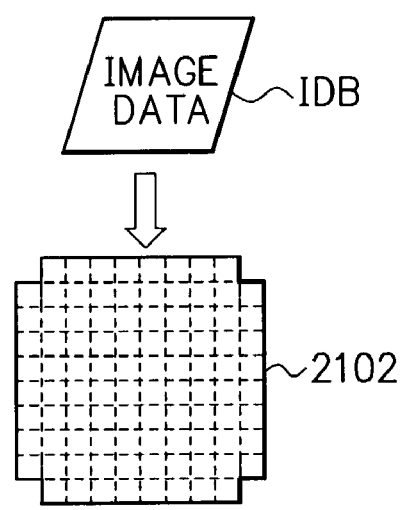
Figure 21C:
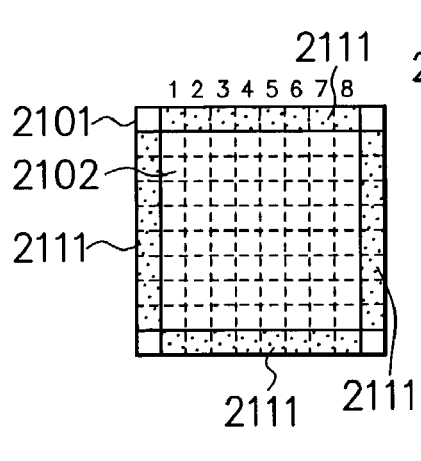

FIG. 21A shows the image data IDA, and FIG. 21B shows the image data IDB. First, an original figure pattern 2101 is extracted from the image data IDA, and a measurement figure pattern 2102 is extracted from the image data IDB. Then, the number of pixels on the outer periphery of the original figure pattern 2101 is counted. For example, the number of pixels per side on the outer periphery is 10. Then, the original figure pattern 2101 and the measurement figure pattern 2102 are superimposed one upon the other, resulting in an appearance in FIG. 21C. Then, the number of pixels at superimposed portions 2111 on the outer periphery of the original figure pattern 2101 upon the outer periphery of the measurement figure pattern 2102, is counted. In this case, the number of pixels at the superimposed portion 2111 per side is 8. Therefore, the ratio between the number of pixels on the outer periphery of the original figure pattern 2101 and the number of pixels of the superimposed portion 2111 thereof, is 0.8, so that this case can be determined as acceptable.

Figure 21D:
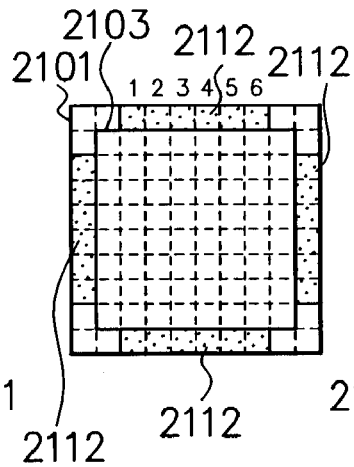

In the case of FIG. 21D, a comparison is made between the original figure pattern 2101 and a measurement figure pattern 2103. The number of pixels at a superimposed portion 2112 per side on the outer periphery of the original figure pattern 2101 upon the outer periphery of the measurement figure pattern 2103, is 6. Therefore, the ratio between the number of pixels on the outer periphery of the original figure pattern 2101 and the number of pixels of the superimposed portion 2112, is 0.6, so that this case can be determined as acceptable.

Figure 21E:
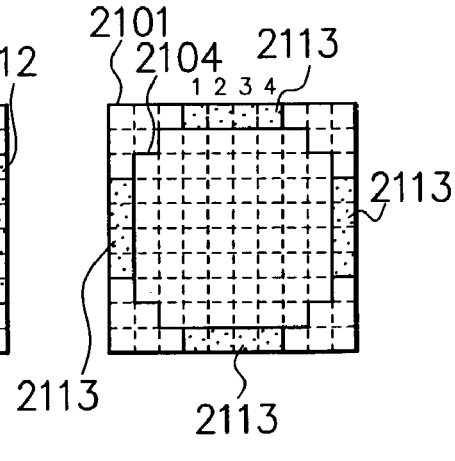

In the case of FIG. 21E, a comparison is made between the original figure pattern 2101 and a measurement figure pattern 2104. The number of pixels at a superimposed portion 2113 per side on the outer periphery of the original figure pattern 2101 upon the outer periphery of the measurement figure pattern 2104, is 4. Therefore, the ratio between the number of pixels on the outer periphery of the original figure pattern 2101 and the number of pixels of the superimposed portion 2113, is 0.4, so that this case can be determined as unacceptable.

It should be noted that the description has been made on the case in which the ratio is obtained based on the number of pixels on the outer periphery of the original figure pattern. However, if the measurement figure pattern becomes larger than the original figure pattern, the ratio may be obtained based on the number of pixels on the outer periphery of the measurement figure pattern.

While the first to fifth embodiments have been described taking, as an example, the case of evaluating the pattern form on the reticle mask, it is also possible to similarly evaluate the pattern form on a semiconductor device (semiconductor wafer).

As described above, in the first to fifth embodiments, at least one parameter of parameters including a part or all of area, outer periphery, barycenter, and diagonal line of the original figure pattern and the measurement figure pattern, is calculated, so that based on the parameter the result of comparison of the original figure pattern and the measurement figure pattern can be outputted. When it is difficult to determine acceptance or non-acceptance by the comparison only regarding area, a determination of acceptance or non-acceptance can be made through comparison regarding area and outer periphery. More specifically, it is preferable to calculate at least two parameters of parameters including a part or all of area, outer periphery, barycenter, and diagonal line of the original figure pattern and the measurement figure pattern, and output the result of comparison of the original figure pattern and the measurement figure pattern based on two or more parameters.

Parameters that can be converted into numeric values are calculated to compare the original figure pattern (the pattern image of the design data) and the measurement figure pattern (the pattern image of the reticle mask or semiconductor device), thus facilitating comparison and enabling easy management of pattern assurance. Further, the pattern can be assured with reliability for assurance of the accuracy of the pattern on the reticle mask and the semiconductor device, resulting in improved yield and performance of the reticle mask and the semiconductor device.

The above-described embodiments can be realized by a computer executing a program. Further, it is also possible to apply, as an embodiment of the present invention, a unit for supplying the program to the computer, for example, a computer readable recording medium such as a CD-ROM or the like recording the program thereon or a transmitting medium such as the Internet or the like transmitting the program. Furthermore, it is also possible to apply, as an embodiment of the present invention, a computer program product such as a computer readable recording medium or the like recording the program thereon. The above program, recording medium, transmitting medium, and computer program product are within the scope of the present invention. It is possible to use, as the recording medium, for example, a flexible disk, a hard disk, an optical disk, a magneto-optic disk, a CD-ROM, a magnetic tape, a non-volatile memory card, a ROM, or the like.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As has been described, parameters that can be converted into numeric values are calculated to compare the pattern image of the design data and the pattern image of the reticle mask or semiconductor device, thus facilitating comparison and enabling easy management of pattern assurance. Further, the pattern can be assured with reliability for assurance of the accuracy of the pattern on the reticle mask and the semiconductor device, resulting in improved yield and performance of the reticle mask and the semiconductor device.

What is claimed is:

1. A pattern image comparison method, comprising:
   a first input step of inputting a first pattern image based on design data for a reticle mask or a semiconductor device;
   a second input step of inputting a second pattern image of said reticle mask or semiconductor device manufactured based on said design data;
   a calculation step of calculating at least one parameter of parameters including a part or all of area, outer periphery, barycenter, and diagonal line of said first pattern image and said second pattern image;
   a comparison step of comparing a pattern on said reticle mask or semiconductor device and a pattern of said design data based on said calculated parameters of said first and second pattern images; and
   an output step of outputting a determination of acceptance or non-acceptance of said pattern on said reticle mask or semiconductor device according to said comparison result.

2. The pattern image comparison method according to claim 1, wherein said calculation step calculates at least two parameters of the parameters including a part or all of area, outer periphery, barycenter, and diagonal line of said first pattern image and said second pattern image.

3. The pattern image comparison method according to claim 1, wherein said calculation step calculates a part or all of the area and the outer periphery of said first pattern image and said second pattern image.

4. The pattern image comparison method according to claim 3, wherein said output step outputs a result of comparing a value obtained by multiplying said calculated area and outer periphery of said first pattern image and a value obtained by multiplying said calculated area and outer periphery of said second pattern image.

5. The pattern image comparison method according to claim 4, wherein said calculation step calculates the area and outer periphery of said first pattern image and an area and an outer periphery of a pattern image made by once reducing and thereafter enlarging said second pattern image.

6. The pattern image comparison method according to claim 3,
   wherein said calculation step calculates the area and outer periphery of said first pattern image and an area and an outer periphery of a pattern image made by once reducing and thereafter enlarging said second pattern image, and wherein said output step outputs a comparison result in accordance with matching rates of said calculated areas and outer peripheries of both and a rate of said reduction and enlargement.

7. The pattern image comparison method according to claim 4, wherein said calculation step calculates an area and an outer periphery of a pattern image made by processing said first pattern image and the area and outer periphery of said second pattern image.

8. The pattern image comparison method according to claim 3, wherein said calculation step calculates an area and an outer periphery of a pattern image made by processing said first pattern image and the area and outer periphery of said second pattern image, and wherein said output step outputs a comparison result in accordance with matching rates of said calculated areas and outer peripheries of both and an amount of said processing.

9. The pattern image comparison method according to claim 1, wherein said calculation step calculates the parameter of said first pattern image and a parameter of a pattern image made by once reducing and thereafter enlarging said second pattern image.

10. The pattern image comparison method according to claim 9, wherein said output step outputs a comparison result in accordance with a matching rate of said calculated parameters of both and a rate of said reduction and enlargement.

11. The pattern image comparison method according to claim 1, wherein said calculation step calculates a parameter of a pattern image made by processing said first pattern image and the parameter of said second pattern image.

12. The pattern image comparison method according to claim 11, wherein said output step outputs a comparison result in accordance with a matching rate of said calculated parameters of both and an amount of said processing.

13. The pattern image comparison method according to claim 1, wherein said calculation step calculates a part or all of the area and the barycenter of said first pattern image and said second pattern image.

14. The pattern image comparison method according to claim 1, wherein said calculation step calculates an amount of superimposition between the outer periphery of said first pattern image and the outer periphery of said second pattern image, and wherein said output step outputs a comparison result in accordance with said amount of superimposition between the outer peripheries.

15. The pattern image comparison method according to claim 14, wherein said output step outputs a comparison result in accordance with a ratio between said amount of superimposition between the outer peripheries and the outer periphery of said first or second pattern image.

16. The pattern image comparison method according to claim 1, wherein said second pattern image is a pattern image of said reticle mask manufactured based on said design data.

17. The pattern image comparison method according to claim 1, wherein said first and second input steps input said first and second pattern images while matching sizes thereof.

18. The pattern image comparison method according to claim 17, wherein said first and second input steps input said first and second pattern images while matching the sizes thereof so that a distance between barycenters of a plurality of patterns in said first pattern image matches a distance between barycenters of a plurality of patterns in said second pattern image corresponding thereto.

19. The pattern image comparison method according to claim 1, wherein said first and second pattern images are binary digital images.

20. A pattern image comparison device, comprising:
a first input unit for inputting a first pattern image based on design data for a reticle mask or a semiconductor device;
a second input unit for inputting a second pattern image of said reticle mask or semiconductor device manufactured based on said design data;
a calculating unit for calculating at least one parameter of parameters including a part or all of area, outer periphery, barycenter, and diagonal line of said first pattern image and said second pattern image;
a comparing unit for comparing a pattern on said reticle mask or semiconductor device and a pattern of said design data based on said calculated parameters of said first and second pattern images; and
an output unit for outputting a determination of acceptance or non-acceptance of said pattern on said reticle mask or semiconductor device according to said comparison result.

21. A computer program product including computer-readable program code stored on a computer-readable medium for controlling a computer to design a circuit, by:
inputting a first pattern image based on design data for a reticle mask or a semiconductor device;
inputting a second pattern image of said reticle mask or semiconductor device manufactured based on said design data;
calculating at least one parameter of parameters including a part or all of area, outer periphery, barycenter, and diagonal line of said first pattern image and said second pattern image;
comparing a pattern on said reticle mask or semiconductor device and a pattern of said design data based on said calculated parameters of said first and second pattern images; and
outputting a determination of acceptance or non-acceptance of said pattern on said reticle mask or semiconductor device according to said comparison result.

* * * * *